(12) United States Patent
Shi et al.

(10) Patent No.: US 11,549,034 B2
(45) Date of Patent: Jan. 10, 2023

(54) OXIDE CHEMICAL MECHANICAL PLANARIZATION (CMP) POLISHING COMPOSITIONS

(71) Applicant: Versum Materials US, LLC, Tempe, AZ (US)

(72) Inventors: Xiaobo Shi, Chandler, AZ (US);
Krishna P. Murella, Phoenix, AZ (US);
Joseph D. Rose, Gilbert, AZ (US);
Hongjun Zhou, Chandler, AZ (US);
Mark Leonard O'Neill, Queen Creek, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/533,542

(22) Filed: Aug. 6, 2019

(65) Prior Publication Data
US 2020/0048496 A1    Feb. 13, 2020

Related U.S. Application Data

(60) Provisional application No. 62/716,784, filed on Aug. 9, 2018, provisional application No. 62/716,769, filed on Aug. 9, 2018.

(51) Int. Cl.
*C09G 1/02* (2006.01)
*C09K 13/00* (2006.01)
(Continued)

(52) U.S. Cl.
CPC ............... *C09G 1/02* (2013.01); *C09K 13/00* (2013.01); *H01L 21/30625* (2013.01);
(Continued)

(58) Field of Classification Search
CPC ............... C09G 1/02; H01L 21/30625; H01L 21/31053; H01L 21/3212; H01L 21/02164;
(Continued)

(56) References Cited

U.S. PATENT DOCUMENTS

| 5,876,490 A | 3/1999 | Ronay |
| 6,616,514 B1 * | 9/2003 | Edelbach ................. C09G 1/02 216/89 |

(Continued)

FOREIGN PATENT DOCUMENTS

| EP | 3231848 A1 | 10/2017 |
| JP | 2018059054 | 4/2018 |

(Continued)

*Primary Examiner* — Lan Vinh
(74) *Attorney, Agent, or Firm* — Lina Yang

(57) ABSTRACT

The present invention provides Chemical Mechanical Planarization Polishing (CMP) compositions for Shallow Trench Isolation (STI) applications. The CMP compositions contain ceria coated inorganic metal oxide particles as abrasives, such as ceria-coated silica particles; chemical additive selected from the first group of non-ionic organic molecules multi hydroxyl functional groups in the same molecule; chemical additives selected from the second group of aromatic organic molecules with sulfonic acid group or sulfonate salt functional groups and combinations thereof; water soluble solvent; and optionally biocide and pH adjuster; wherein the composition has a pH of 2 to 12, preferably 3 to 10, and more preferably 4 to 9.

20 Claims, 8 Drawing Sheets

(51) Int. Cl.
    *H01L 21/3105*  (2006.01)
    *H01L 21/321*   (2006.01)
    *H01L 21/306*   (2006.01)
    *C09K 13/04*    (2006.01)

(52) U.S. Cl.
    CPC .... *H01L 21/31053* (2013.01); *H01L 21/3212* (2013.01); *C09K 13/04* (2013.01)

(58) Field of Classification Search
    CPC ....... H01L 21/304; C09K 13/00; C09K 13/04; C09K 3/1436; C09K 3/1463; C09K 3/1454; B24B 37/044
    USPC .... 252/79.1, 79.2, 79.3, 79.4; 438/691, 692, 438/693

See application file for complete search history.

(56) References Cited

U.S. PATENT DOCUMENTS

| | | | |
|---|---|---|---|
| 6,964,923 | B1 | 11/2005 | Ronay |
| 7,091,164 | B2 | 8/2006 | Srinivasan et al. |
| 9,293,344 | B2 | 3/2016 | Fukasawa et al. |
| 2012/0077419 | A1* | 3/2012 | Zhang ................... C01F 17/206 451/36 |
| 2016/0108284 | A1 | 4/2016 | Yoshizaki |
| 2016/0200944 | A1 | 7/2016 | Zhou et al. |
| 2017/0088748 | A1 | 3/2017 | Stender et al. |
| 2019/0062593 | A1 | 2/2019 | Penta et al. |
| 2020/0071566 | A1* | 3/2020 | Park ........................ C09G 1/02 |

FOREIGN PATENT DOCUMENTS

| | | | |
|---|---|---|---|
| KR | 20050122754 A | * 12/2005 | ........... C09K 3/1463 |
| KR | 100851235 B1 | * 8/2008 | |
| TW | I628248 | 7/2018 | |
| WO | 2006001558 A1 | 1/2006 | |

\* cited by examiner

OXIDE CHEMICAL MECHANICAL PLANARIZATION (CMP) POLISHING COMPOSITIONS

CROSS REFERENCE TO RELATED APPLICATION(S)

This application claims the benefit of U.S. Provisional Patent Application No. 62/716,784 and U.S. Provisional Patent Application No. 62/716,769, both filed on Aug. 9, 2018, which are incorporated herein by reference as if fully set forth.

BACKGROUND

This application relates to oxide or doped-oxide film chemical mechanical planarization (CMP) compositions and chemical mechanical planarization (CMP) methods and systems for polishing oxide or doped oxide films.

In the fabrication of microelectronics devices, an important step is polishing, especially surfaces for chemical-mechanical polishing/planarization for recovering a selected material and/or planarizing the structure.

For example, a SiN layer may be deposited under a $SiO_2$ layer to serve as a polish stop layer. The role of such a polish stop is particularly important in Shallow Trench Isolation (STI) structures. Selectivity is characteristically expressed as the ratio of the oxide polish rate to the nitride polish rate. An example is an increased polishing selectivity rate of silicon dioxide ($SiO_2$) as compared to silicon nitride (SiN).

In the global planarization of patterned STI structures, increasing oxide film removal rates, reducing SiN film removal rates and reducing oxide trench dishing are three key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, there is a need to reduce trench oxide loss by reducing oxide trench dishing in oxide or doped-oxide film CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. The molecular weights for such polyelectrolyte is from 300 to 20,000, but overall, less than 100,000.

U.S. Pat. No. 6,616,514 B1 discloses a chemical mechanical polishing slurry for use in removing a first substance from a surface of an article in preference to silicon nitride by chemical mechanical polishing. The chemical mechanical polishing slurry according to the invention includes an abrasive which is calcined ceria particles, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium. The polyols used as chemical additives included mannitol, mannose, xylitol, sorbose etc. This prior art claimed the high oxide: SiN selectivity was achieved by using these chemical additives plus calcined ceria abrasives in the polishing compositions. But the polishing test results using two chemical additives at the concentrations listed in this prior art showed very low oxide removal rates at pH 9.5 and with 1.0% calcined ceria and 2.0% chemical additive(s). There was no patterned wafer data being listed at all in this prior art.

U.S. Pat. No. 9,293,344 B2 discloses a chemical mechanical polishing slurry which used calcined ceria as abrasives, and water-soluble polymer as chemical additive, such water-soluble polymer was prepared using a monomer containing at least one of a carboxylic acid having a double bond and the salt. Such slurry is for use in removing a first substance of dielectric films from a surface of an article in preference to silicon nitride by chemical mechanical polishing. The chemical mechanical polishing slurry according to the invention includes an abrasive, an aqueous medium, and water-soluble organic polymer.

U.S. Pat. No. 7,091,164 B2 discloses a chemical mechanical polishing slurry which used ceria/or titania as abrasives, and chemical additives with a carboxylic group and an electrophilic functional group. Mainly these chemical additives are amino acids or amino acid derivatives. About 5:1 oxide: SiN selectivity was achieved in this prior art. The pH range listed in this prior art was from 6 to about 11.

US Patent Application 2019/0062593 A1 discloses a chemical mechanical polishing slurry which used elongated, bent, or nodular silica particles as abrasives in the 0.5 to 30 weight percent range and a cationic polymer (diallylalkylamine salt, diallylalkylammonium chloride) or a mixed copolymer chemical additive with a carboxylic group and an electrophilic functional group. Such polishing slurry afforded good oxide: SiN selectivity.

However, those prior disclosed Shallow Trench Isolation (STI) polishing compositions did not address the importance of oxide film removal rates, SiN film removal rate suppressing and oxide trench dishing reducing at the same polishing process and more uniform oxide trench dishing on the polished patterned wafers along with the high oxide versus nitride selectivity.

Therefore, it should be readily apparent from the foregoing that there remains a need within the art for compositions, methods and systems of STI chemical mechanical polishing that can provide increased oxide film removal rates, reduced SiN film removal rates and the reduced oxide trench dishing and more uniformed oxide trench dishing across various sized oxide trench features on polishing patterned wafers in a STI chemical and mechanical polishing (CMP) process, in addition to high removal rate of silicon dioxide as well as high selectivity for silicon dioxide to silicon nitride.

BRIEF SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments, as described below and as defined by the claims which follow, comprise oxide or doped-oxide film polishing compositions providing increased oxide film removal rates, suppressed SiN film removal rates, increased TEOS: SiN selectivity and reduced oxide trench dishing on the polished patterned wafers.

The present invented oxide or doped-oxide film CMP polishing compositions also provides high oxide vs nitride selectivity by introducing two different types of chemical additives as oxide film removal rate boosting agents, SiN film removal rate suppressing agents and oxide trenching dishing reducers in the Chemical mechanical polishing (CMP) compositions for Shallow Trench Isolation (STI) CMP applications at wide pH range including acidic, neutral and alkaline pH conditions.

The disclosed chemical mechanical polishing (CMP) compositions for oxide or doped-oxide film CMP polishing applications have a unique combination of using ceria-coated inorganic oxide as abrasive particles and suitable chemical additives as oxide trench dishing reducing agents, oxide film removal rate boosting agents and nitride suppressing agents.

In addition, several specific aspects of the systems and methods of the subject matter disclosed.

Aspect 1: A chemical mechanical planarization (CMP) composition comprising:
a. an abrasive;
b. a first additive consisting of an organic compound comprising a plurality of hydroxyl functional groups;
c. a second additive consisting of an aromatic organic compound comprising sulfonate or sulfonic acid functional groups;
d. a solvent.

Aspect 2: The CMP composition of Aspect 1, wherein the abrasive is selected from the group consisting of ceria-coated inorganic oxides, ceria coated organic polymer particles, and combinations thereof.

Aspect 3: The CMP composition of Aspect 2, wherein the abrasive is a ceria-coated inorganic oxide selected from the group consisting of: ceria-coated colloidal silica; ceria-coated high purity colloidal silica; ceria-coated alumina; ceria-coated titania; ceria-coated zirconia; and combinations thereof.

Aspect 4: The CMP composition of any of Aspects 1-3, wherein the abrasive ranges from 0.05 to 10 percent by weight of the CMP composition, based on the total weight of the composition.

Aspect 5: The CMP composition of any of Aspects 1-4, wherein the aromatic organic compound comprising sulfonate or sulfonic acid functional groups comprises sulfonate or sulfonic acid functional groups directly bonded to aromatic rings or linked to aromatic rings through alkyl bridging groups.

Aspect 6: The CMP composition of any of Aspects 1-5, wherein the solvent is selected from the group consisting of water, ethers and alcohols.

Aspect 7: The CMP composition of any of Aspects 1-6, further comprising at least one of a biocide and a pH adjuster.

Aspect 8: The CMP composition of any of Aspects 1-7, wherein the composition comprises a pH ranging from 3 to 10.

Aspect 9: The CMP composition of any of Aspects 1-8, wherein the composition comprises a pH ranging from 4.5 to 7.5.

Aspect 10: The CMP composition of any of Aspects 1-9, wherein the first additive has a general molecular structure of:

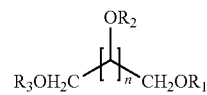

wherein: n is selected from 2 through 5,000 and R1, R3 and each occurrence of R2 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, and organic amine groups.

Aspect 11: The CMP composition of Aspect 10, wherein R1, R2, and R3 are hydrogen.

Aspect 12: The CMP composition of Aspect 10, wherein n is selected from 3 through 12.

Aspect 13: The CMP composition of Aspect 10, wherein the first additive is selected from the group consisting of: ribitol, xylitol, meso-erythritol, D-sorbitol, mannitol, dulcitol, iditol and combinations thereof.

Aspect 14: The CMP composition of any of Aspects 1-13, wherein the first additive has a general molecular structure of:

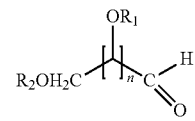

wherein n is selected from 2 to 5,000, and R2 and each occurrence of R1 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester and organic amine groups.

Aspect 15: The CMP composition of Aspect 14, wherein n is selected from 3 through 12.

Aspect 16: The CMP composition of Aspect 14, wherein R1 and R2 are hydrogen and n is selected from 3 through 4.

Aspect 17: The CMP composition of any of Aspects 1-16, wherein the first additive has a general molecular structure selected from the group consisting of:

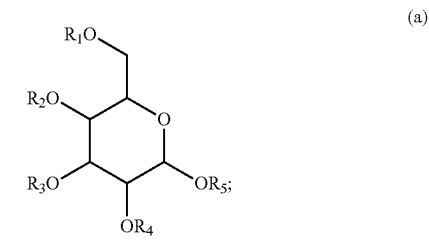

(a)

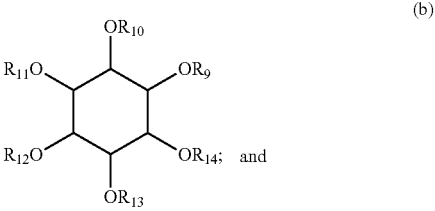

(b)

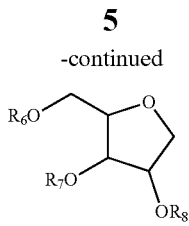

(c)

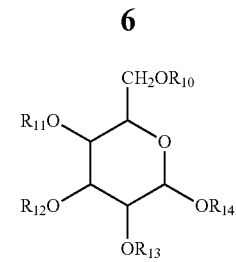

wherein R1, R2, R3, R4, R5, R6, R7, R8, R9, R10, R12, R13, and R14 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, and organic amine groups, with the proviso that at least two occurrences of R1 through R14 in each structure are hydrogen.

Aspect 18: The CMP composition of Aspect 17, wherein the first additive is selected from the group consisting of: D-(−)-fructose, sorbitan, sucrose, beta-lactose, D-ribose, inositol, glucose and combinations thereof.

Aspect 19: The CMP composition of any of Aspects 1-17, wherein the first additive has a general molecular structure:

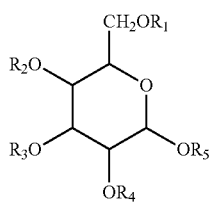

wherein R1 through R5 are independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine.

Aspect 20: The CMP composition of Aspect 19 wherein at least one of R1 through R5 is a polyol molecular unit having the structure:

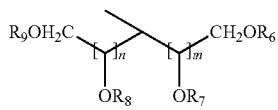

wherein n and m are independently selected from 1 through 5, and R6 through R9 are independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine.

Aspect 21: The CMP composition of Aspect 20, wherein n and m are independently selected from 1 through 3.

Aspect 22: The CMP composition of Aspect 20, wherein at least one of R1 through R5 is a six-member ring polyol having the structure:

wherein R10, R11, R12, R13 and R14 are independently selected from the group consisting of hydrogen, alkyl, alkoxy, organic group with one or more hydroxyl groups, substituted organic sulfonic acid or salt, substituted organic carboxylic acid or salt, organic carboxylic ester, and an organic amine.

Aspect 23: The CMP composition of Aspect 22, wherein at least two of R1 to R9 are hydrogen atoms.

Aspect 24: The CMP composition of Aspect 22, wherein at least six of R1 to R9 are hydrogen atoms.

Aspect 25: The CMP composition of Aspect 19, wherein the first additive is selected from the group consisting of: maltitol, lactitol and maltotritol.

Aspect 26: The CMP composition of any of Aspects 1-25, wherein the first additive ranges from 0.005 to 1.0 weight percent based on the total weight of the composition.

Aspect 27: The CMP composition of any of Aspects 1-26, wherein the second additive has a general molecular structure:

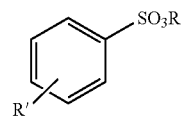

wherein R is selected from the group comprising hydrogen, a sodium ion, a potassium ion and an ammonium ion; and R' is an alkyl group connected at alpha, meta, or para-positions relative to the sulfonic acid or sulfonate group, and comprising a structure of CnH2n+1 wherein n is selected from 1 through 18.

Aspect 28: The CMP composition of Aspect 27, wherein the second additive is selected from the group consisting of: 4-dodecylbenzenesulfonic acid or its ammonium, sodium or potassium salt; 4-methylbenzene sulfonic acid or its ammonium, sodium or potassium salt; and combinations thereof.

Aspect 29: A method of chemical mechanical polishing (CMP) a semiconductor substrate having at least one surface comprising a silicon oxide film, comprising:
  a. contacting the at least one surface comprising a silicon oxide with a CMP polishing pad and the CMP composition of any of Aspects 1 through 28; and
  b. polishing the least one surface comprising silicon dioxide.

Aspect 30: The method of Aspect 29; wherein the silicon oxide film is selected from the group consisting of Chemical vapor deposition (CVD), Plasma Enhance CVD (PECVD), High Density Deposition CVD(HDP), and spin on silicon oxide film.

Aspect 31: The method of Aspect 30, wherein the silicon oxide film is SiO2 film.

Aspect 32: The method of Aspect 31; wherein the semiconductor substrate further comprises a silicon nitride surface; and the step (b) comprises polishing the least one surface comprising silicon dioxide at a removal selectivity of silicon oxide: silicon nitride greater than 60.

DETAILED DESCRIPTION

Figure 1:
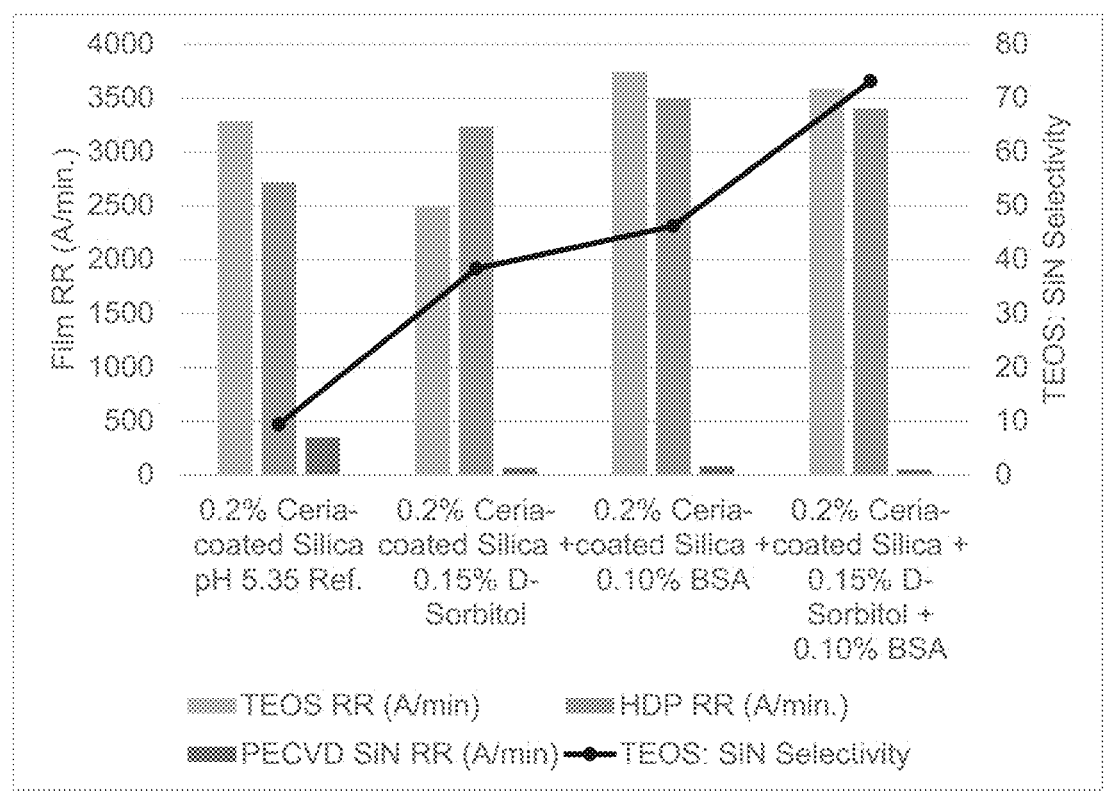
FIG. 1. Effects of Chemical Additives on Film RR (Å/min.) & TEOS: SiN Selectivity.

The ensuing detailed description provides preferred exemplary embodiments only, and is not intended to limit the scope, applicability, or configuration of the claimed invention. Rather, the ensuing detailed description of the preferred exemplary embodiments will provide those skilled in the art with an enabling description for implementing the preferred exemplary embodiments. Various changes may be made in the function and arrangement of elements without departing from the spirit and scope of the invention, as set forth in the appended claims.

All terms defined herein should be afforded their broadest possible interpretation, including any implied meanings as dictated by a reading of the specification as well as any words that a person having skill in the art and/or a dictionary, treatise, or similar authority would assign particular meaning. Further, it should be noted that, as recited in the specification and in the claims appended hereto, the singular forms "a," "an," and "the" include the plural referents unless otherwise stated. Additionally, the terms "comprises" and "comprising" when used herein specify that certain features are present in that embodiment, but should not be interpreted to preclude the presence or addition of additional features, components, operations, and/or groups thereof.

Disclosed herein are CMP polishing compositions for polishing oxide material, and related methods and systems, that satisfy the need for polishing semiconductor wafers comprising silicon oxide structures. In the global planarization of patterned STI structures, suppressing SiN removal rates and reducing oxide trench dishing across various sized oxide trench features are key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

This invention relates to the Chemical mechanical polishing (CMP) compositions for oxide or doped-oxide film polishing CMP applications. The CMP compositions disclosed herein are particularly suited for planarization of patterned STI structures.

More specifically, the disclosed chemical mechanical polishing (CMP) composition for polishing oxide or doped-oxide film CMP applications has a unique formulation comprising an abrasive and two types of additives that function as oxide trench dishing reducing agents, oxide film removal rate boosting agents and nitride removal rate suppressing agents. The CMP composition also comprises a solvent. Other optional ingredients such as biocides, pH adjusters may also be present in the formulation.

In preferred embodiments the abrasive comprises ceria-coated inorganic oxide particles or ceria-coated organic polymer particles. Preferably, the first additive is a non-ionic and non-aromatic organic molecule bearing multiple hydroxyl functional groups and the second additive is an organic aromatic molecule bearing sulfonic acid or sulfonate salt functional groups.

The components of the CMP formulation are discussed in greater detail below. The paragraph headings that follow are solely to provide organization to the disclosure and are not intended to limit the scope of the claimed invention in any way.

The Abrasive

In an embodiment, the abrasive comprises ceria-coated organic polymer particles include, but are not limited to, ceria-coated polystyrene particles, ceria-coated polyurethane particle, ceria-coated polyacrylate particles, or any other ceria-coated organic polymer particles.

In a preferred embodiment, the abrasive comprises ceria-coated inorganic oxide particles including, but are not limited to, ceria-coated colloidal silica, ceria-coated high purity colloidal silica, ceria-coated alumina, ceria-coated titania, ceria-coated zirconia, or any other ceria-coated inorganic oxide particles. Preferred ceria-coated inorganic oxide particles are ceria-coated colloidal silica particles.

In embodiments, the particle size of the ceria-coated inorganic metal oxide particles ranges from 2 to 1,000 nanometers. The preferred mean particle size ranges from 5 to 500 nanometers, more preferably from 20 to 250 nanometers.

In embodiments, the concentration of the ceria-coated inorganic metal oxide particles ranges from 0.01 to 20 weight percent, based on the total weight of the CMP composition. Preferably, the concentration ranged from 0.05 to 10 weight percent, more preferably from 0.1 to 5 weight percent.

The First Additive

In embodiments, the First Additive is a non-ionic and non-aromatic organic molecule bearing multiple hydroxyl functional groups.

In an embodiment, First Additive comprises the general molecular structure:

Formula (I)

where n is selected from 2 to 5,000, preferably from 3 to 12 and more preferably from 4 to 7. R1, R3 and each occurrence of R2 are independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, an organic amine group. R1, R2 and R3 may be the same or different groups. Preferably, two or more occurrences of R1, R2 and R3 are hydrogen atoms. More preferably, four or more occurrences of R1, R2 and R3 are hydrogen atoms. When R1, R2, and R3 are the same and are hydrogen atoms, the chemical additive bears multiple hydroxyl functional groups.

Preferred examples of the First Additive having the general molecular structure of Formula 1 include, but are not limited to, ribitol, xylitol, meso-erythritol, D-sorbitol, mannitol, dulcitol, and iditol.

In another embodiment, the First Additive comprises the general molecular structure:

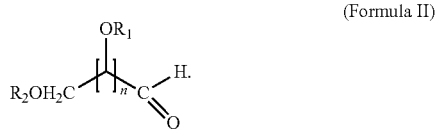

(Formula II)

In this embodiment, a carbonyl (CHO) functional group is located at one end of the molecule as the terminal functional group and n ranges from 2 to 5,000, preferably from 3 to 12, and more preferably from 4 to 7. R2 and each occurrence of R1 are independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, an organic amine group, and combinations thereof.

In a preferred embodiment, n=3, and R2 and all occurrences of R1 are hydrogen atoms. In this embodiment the First Additive is D-arabinose or L-arabinose. In another preferred embodiment, n=4, and R2 and all occurrences of R1 are hydrogen atoms. In this embodiment the First Additive is D-mannose or L-mannose.

In another embodiment, the First Additives has a general molecular structure selected from the group consisting of:

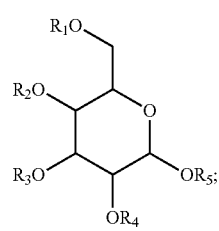

(a)

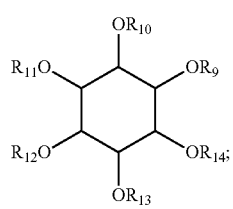

(b)

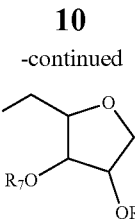

(c)

and combinations thereof,
wherein R1, R2, R3, R4, R5, R6, R7, R8, R9, R10, R11, R12, R13, and R14 are independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group, with the proviso that at least two occurrences of R1 through R14 in each structure are hydrogen. Preferably at least three occurrences of R1 through R14 in each structure are hydrogen. More preferably, at least four occurrences of R1 through R14 in each structure (where possible) are hydrogen.

Preferred examples of First Additives having the structure of this embodiment include, but are not limited to D-(−)-fructose, sorbitan, sucrose, beta-lactose, D-ribose, inositol, and glucose.

In another embodiment, the First Additive contains at least one six-member ring ether structural motif bonded to at least one polyol molecular unit containing multiple hydroxyl functional groups in the molecular unit structures, or at least one polyol molecular unit containing multiple hydroxyl functional groups in the molecular unit structures and at least one six-member ring polyol. As used herein a polyol is an organic compound containing more than two hydroxyl groups.

The general molecular structure for the First Additive of this embodiment is:

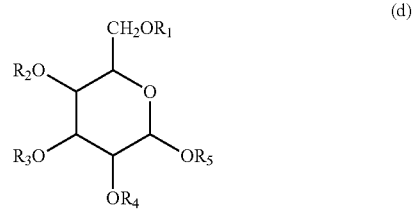

(d)

wherein R1, R2, R3, R4, and R5 are independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group.

In a preferred embodiment, at least one R in the group of R1 to R5 in the general molecular structure (d) is a polyol molecular unit having a structure shown in (e):

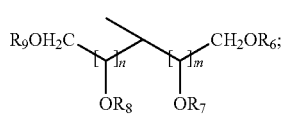

(e)

wherein n and m are independently selected from 1 to 5, preferably from 1 to 4, more preferably from 1 to 3, and most preferably from 1 to 2. R6, R7, R8 and R9 are independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group.

In another embodiment, at least one R in the group of R1 to R5 in the general molecular structure (d) is a polyol molecular unit having a structure shown in (e); at least one R in the group of R1 to R5 in the general molecular structure is a six-member ring polyol as shown in (f):

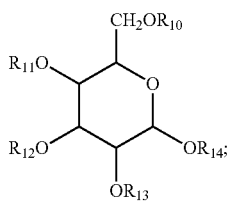
(f)

wherein each of R10, R11, R12, R13 and R14 is independently selected from the group consisting of hydrogen, an alkyl group, an alkoxy group, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group.

In the general molecular structure, at least two, preferably four, more preferably six occurrences of R in the group of R1 to R9 are hydrogen atoms. When only one R, such as R5 in the group of R1 to R5 in the general molecular structure is a polyol molecular unit (e) having n=2 and m=1; and all rest of Rs in the group of R1 to R9 are all hydrogen atoms, the following two chemical additives are obtained: maltitol and lactitol.

When one R, such as R5 is a polyol molecular unit (e) having n=2 and m=1; and one R, such as R2 is a six-member ring polyol (f); and all rest of Rs in the group of R1 to R14 are all hydrogen atoms, the following chemical additive is obtained: maltotritol.

Preferred first additives include, but are not limited to, maltitol, lactitol, maltotritol, ribitol, D-sorbitol, mannitol, dulcitol, iditol, D-(-)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(-)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(-)-Fructose, beta-lactose, and combinations thereof.

The CMP composition contains 0.0001 wt. % to 2.0% wt. %, preferably 0.001 wt. % to 1.0 wt. %, and preferable 0.0025 wt. % to 0.5 wt. % Of the First additive, based on the total weight of the CMP composition.

The Second Additive

In a preferred embodiment the second additive is an organic aromatic molecule with sulfonic acid or sulfonate functional groups represented by the general structural formulas:

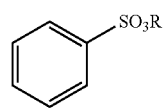
(g)

where —R can be hydrogen atom or a metal ion; or

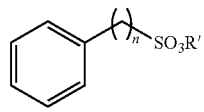
(h)

where —R' can be hydrogen atom or a metal ion; and n can be range from 1 to 12 which represents the various length of alkyl linkage group —$CH_2$—; and combinations of (g) and (h). When R or —R' is hydrogen atom, the chemical additive is benzenesulfonic acid. When —R or —R' is a metal ion such as sodium ion, potassium ion, or ammonium ion, the chemical additive is a salt of benzenesulfonate.

In another embodiment, the general molecular structure (i) for the second group of chemical additives is an organic aromatic molecule with sulfonic acid or sulfonate functional groups connected to one location of aromatic rings and at other location of the aromatic rings, other functional groups as shown in formula (i):

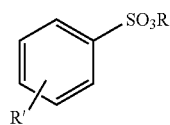
(i)

where —R can be hydrogen atom or a metal ion; when —R is a hydrogen ion, the additive is a benzenesulfonic acid molecular derivatives; When —R can be a metal ion, such as sodium ion, potassium ion or ammonium ion, the additive is a benzenesulfonate molecular derivative. —R' is another functional group which can be connected at alpha, meta, or para-positions towards sulfonic acid or sulfonate groups. Typically, —R' is an alkyl group with —$C_nH_{2n+1}$ structure, the carbon chain length can range from —C1 to —C18.

Some examples of second group chemical additives are 4-dodecylbenzenesulfonic acid and 4-methylbenzene sulfonic acid or their ammonium, sodium or potassium salt.

In embodiments, the CMP composition contains 0.0001 wt. % to 2.0% wt. %, preferably 0.001 wt. % to 1.5 wt. %, and preferable 0.002 wt. % to 1.0 wt. % of the Second Additive.

Solvent

The CMP formulation comprises a solvent. Preferably, the solvent is water or a water-soluble solvent. Preferred solvents include, but are not limited to, deionized (DI) water, distilled water, and alcohols. A more preferred solvent is DI water.

Optional Ingredients

Optionally, the CMP comprises a biocide. Preferred biocide includes, but are not limited to, Kathon™, Kathon™ CG/ICP II and Bioban, available from Dupont/Dow Chemical Co. The preferred biocides comprise at least one of the active ingredients 5-chloro-2-methyl-4-isothiazolin-3-one and 2-methyl-4-isothiazolin-3-one. The STI CMP composition may contain biocide from 0.0001 wt. % to 0.05 wt. %; preferably from 0.0005 wt. % to 0.025 wt. %, and more preferably from 0.001 wt. % to 0.01 wt. %.

The STI CMP composition may optionally contain a pH adjusting agent. An acidic or basic pH adjusting agent can be used to adjust the STI polishing compositions to the optimized pH value. Preferred pH adjusting agents include, but are not limited to nitric acid, hydrochloric acid, sulfuric acid, phosphoric acid, other inorganic or organic acids, and mixtures thereof. Preferred pH adjusting agents also include basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction. When a pH adjusting agent is present, the CMP composition contains 0 wt. % to 1 wt. %; preferably 0.01 wt. % to 0.5 wt. %; more preferably 0.1 wt. % to 0.25 wt. % pH adjusting agent.

Method of Use

In some embodiments, the CMP polishing compositions can be made into two or more components and mixed at the point of use.

In an embodiment, there is provided a method of chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD (HDP), spin on oxide films or flowable CVD oxide film, carbon doped oxide film, or nitrogen doped oxide film.

The substrate disclosed above can further comprises a silicon nitride surface. The removal selectivity of $SiO_2$:SiN is greater than 30, preferably greater than 60, and more preferably greater than 80.

In another aspect, there is provided a method of chemical mechanical polishing (CMP) a substrate having at least one surface comprising silicon dioxide using the chemical mechanical polishing (CMP) composition described above in Shallow Trench Isolation (STI) process. The polished oxide films can be CVD oxide, PECVD oxide, High density oxide, or Spin on oxide films.

The following non-limiting examples are presented to further illustrate the present invention.

CMP Methodology

In the examples presented below, CMP experiments were run using the procedures and experimental conditions given below.

Glossary

Components

Ceria-coated Silica: used as abrasive having a particle size of approximately 100 nanometers (nm); such ceria-coated silica particles can have a particle size of ranged from approximately 2 nanometers (nm) to 1000 nanometers (nm);

Ceria-coated Silica particles (with varied sizes) were supplied by JGC Inc. in Japan.

Chemical additives, such as benzenesulfonic acids or its salts; and maltitol, D-Fructose, Dulcitol, D-sorbitol and other chemical raw materials were supplied by Sigma-Aldrich, St. Louis, Mo.

TEOS: tetraethyl orthosilicate

Polishing Pad: Polishing pad, IC1010, IC1000 and other pads were used during CMP, supplied by DOW, Inc.

Parameters

General

Å or A: angstrom(s)—a unit of length

BP: back pressure, in psi units

BSA: benzenesulfonic acid

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: composition flow, ml/min

Wt. %: weight percentage (of a listed component)

TEOS: SiN Selectivity: (removal rate of TEOS)/(removal rate of SiN)

HDP: high density plasma deposited TEOS

TEOS or HDP Removal Rates: Measured TEOS or HDP removal rate at a given down pressure. The down pressure of the CMP tool was 3.0 psi in the examples listed above.

SiN Removal Rates: Measured SiN removal rate at a given down pressure. The down pressure of the CMP tool was 3.0 psi in the examples listed.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An 101000 pad supplied by DOW, Inc, 451 Bellevue Rd., Newark, Del. 19713 was used on platen 1 for blanket and pattern wafer studies.

The IC1010 pad or other pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 3.0 psi DF, composition flow; 200 ml/min. The polishing pad used for testing was IC1010 pad which was supplied by Dow Chemicals.

Deionized water was used as the solvent in the compositions in the working examples.

The composition was used in polishing experiments on patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

TEOS: SiN Selectivity: (removal rate of TEOS)/(removal rate of SiN) obtained from the STI CMP polishing compositions were tunable.

WORKING EXAMPLES

In the following working examples, a STI polishing composition comprising 0.2 wt. % cerium-coated silica particles, a biocide ranging from 0.0001 wt. % to 0.05 wt. %, and deionized water with pH being adjusted to 5.35 was prepared as reference(ref.) or other selected pH conditions.

The polishing compositions were prepared with the reference (0.2 wt. % cerium-coated silica, a biocide ranging from 0.0001 wt. % to 0.05 wt. %, and deionized water) and a first type of chemical additive or a second type of chemical additive or the mixed first type and second type of chemical additives with pH valued at 5.35 respectively or at other selected pH conditions.

Example 1

In Example 1, the polishing compositions used for oxide polishing were shown in Table 1. The reference sample was made by using 0.2 wt. % ceria-coated silica particles, very low concentration of biocide, and DI water.

The first type of chemical additive, D-sorbitol, was used at 0.15 wt. % and mixed with reference sample.

The second type of chemical additive, benzenesulfonic acid, was used at 0.10 wt. % and mixed with reference sample.

The first type of chemical additive D-sorbitol was used at 0.15 wt. % and second type of chemical additive benzenesulfonic acid was used at 0.10 wt. % and mixed with reference sample.

All reference sample and testing samples had same pH values at around 5.35.

The removal rates (RR at Å/min) for polishing different films were tested. The effects of chemical additives on the film removal rates and TEOS: SiN film selectivity were observed and listed in Table 1 and depicted in FIG. 1.

TABLE 1

Effects of Chemical Additives on Film RR (Å/min.) & TEOS:SiN Selectivity

| Compositions | TEOS RR (Å/min.) | HDP RR (Å/min.) | PECVD SiN RR (Å/min.) | TEOS:SiN Selectivity |
|---|---|---|---|---|
| 0.2% Ceria-coated Silica pH 5.35 Ref. | 3279 | 2718 | 349 | 9.4 |
| 0.2% Ceria-coated Silica + 0.15% D-Sorbitol | 2489 | 3229 | 65 | 38.3 |
| 0.2% Ceria-coated Silica + 0.10% BSA | 3744 | 3497 | 81 | 46.2 |
| 0.2% Ceria-coated Silica + 0.15% D-Sorbitol + 0.10% BSA | 3584 | 3399 | 49 | 73.1 |

The polishing step conditions used were: Dow's IC1010 pad at 3.0 psi DF with table/head speed at 87/93 rpm and ex-situ conditioning.

As the results shown in Table 1 and FIG. 1, the addition of D-sorbitol as chemical additive into the polishing composition effectively suppressed SiN film removal rates, and boosted HDP film removal rates. Thus, the TEOS: SiN selectivity was increased significantly.

The addition of benzenesulfonic acid into the polishing composition was not only suppressed SiN film removal rates, but also boosted both TEOS and HDP film removal rates. Thus, further increased TEOS: SiN selectivity was achieved while comparing the selectivity obtained from reference sample.

When both first type of additive D-sorbitol and second type of additive BSA were added into the same polishing composition, both TEOS and HPD film removal rates were still being boosted and SiN film removal rates were being further suppressed. Thus, the highest TEOS: SiN selectivity was achieved while using both types of additives in the same polishing composition while comparing the TEOS: SiN selectivity obtained using these additives alone or without using any of them.

TABLE 2

Effects of D-Sorbitol & BSA Additives on Oxide Trench Dishing (Å) vs OP Times (Sec.)

| Compositions | OP Times (Sec.) | 100 um pitch dishing | 200 um pitch dishing |
|---|---|---|---|
| 0.2% Ceria-coated Silica pH 5.35 Ref. | 0 | 165 | 291 |
|  | 60 | 857 | 1096 |
|  | 120 | 1207 | 1531 |
| 0.2% Ceria-coated Silica + 0.15% D-Sorbitol | 0 | 98 | 184 |
|  | 60 | 261 | 383 |
|  | 120 | 418 | 583 |
| 0.2% Ceria-coated Silica + 0.10% BSA | 0 | 343 | 523 |
|  | 60 | 1042 | 1306 |
|  | 120 | 1220 | 1573 |
| 0.2% Ceria-coated Silica + 0.15% D-Sorbitol + 0.10% BSA | 0 | 341 | 477 |
|  | 60 | 390 | 560 |
|  | 120 | 469 | 653 |

While comparing the TEOS: SiN selectivity, the polishing composition using both chemical additives afforded 73:1 selectivity which is much higher than 9:1 selectivity obtained from reference sample.

Example 2

In Example 2, the polishing compositions used for polishing tests were shown in Table 2. The reference sample was made by using 0.2 wt. % ceria-coated silica particles, very low concentration of biocide, and deionized wafer at pH 5.35.

D-sorbitol or benzenesulfonic acid (BSA) was used alone or used together at 0.15 wt. % or 0.1 wt. % respectively in the testing samples.

All reference sample and testing samples had same pH values at around 5.35.

Figure 2:
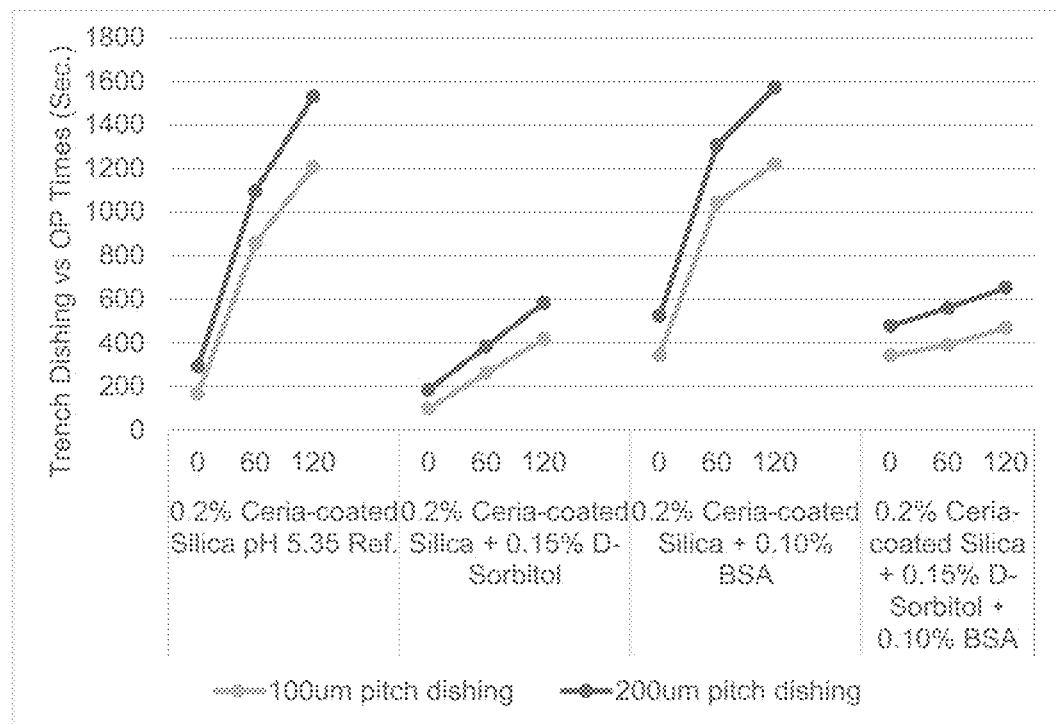
FIG. 2. Effects of D-Sorbitol & BSA Additives on Oxide Trench Dishing (Å) vs. OP Times (Sec).

The effects of D-sorbitol or benzenesulfonic acid (BSA) or D-sorbitol+BSA on the oxide trenching dishing vs different over polishing times were tested and the results were listed in Table 2 and depicted in FIG. 2.

As the results shown in Table 2 and FIG. 2, the addition of first type of additive D-sorbitol as the chemical additive in the polishing composition reduced oxide trench dishing significantly vs different over polishing times while comparing the oxide trench dishing obtained vs different over polishing times obtained from reference sample.

The addition of second type of additive BSA provided slightly worse oxide trench dishing vs over polishing times than that from reference sample.

When using D-sorbitol and BSA as dual chemical additives in the same polishing composition, significant oxide trench dishing reductions vs over polishing times were achieved vs reference sample.

The dual chemical additives based polishing composition provided more stable over polishing window which comparing that using each of these two additives alone.

Figure 3:
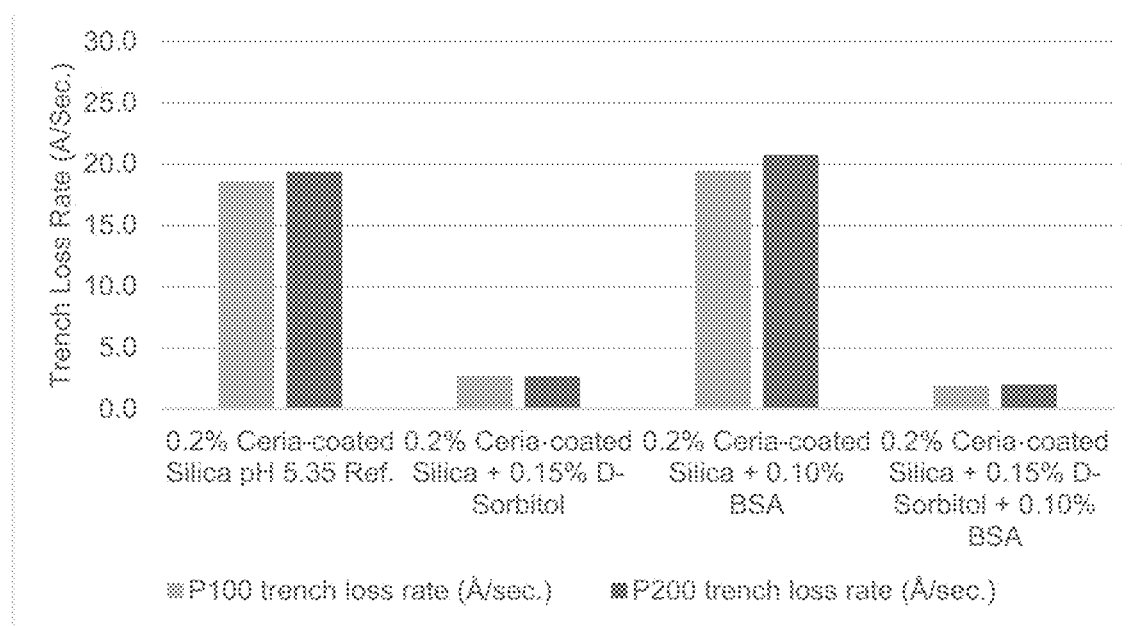
FIG. 3. Effects of D-sorbitol & BSA Additives on Oxide Trench Loss Rates (Å/sec.).

The effects of D-sorbitol or benzenesulfonic acid (BSA) or D-sorbitol+BSA on the oxide trenching loss rates (Å/sec.) were tested and the results were listed in Table 3 and depicted in FIG. 3.

TABLE 3

Effects of D-sorbitol & BSA Additives on Oxide Trench Loss Rates (Å/sec.)

| Compositions | P100 trench loss rate (Å/sec.) | P200 trench loss rate (Å/sec.) |
| --- | --- | --- |
| 0.2% Ceria-coated Silica pH 5.35 Ref. | 18.5 | 19.3 |
| 0.2% Ceria-coated Silica + 0.15% D-Sorbitol | 2.6 | 2.6 |
| 0.2% Ceria-coated Silica + 0.10% BSA | 19.4 | 20.7 |
| 0.2% Ceria-coated Silica + 0.15% D-Sorbitol + 0.10% BSA | 1.8 | 1.9 |

As the results shown in Table 3 and FIG. 3, the addition of first type of additive D-sorbitol as the chemical additive in the polishing composition reduced oxide trench loss rates significantly while comparing the oxide trench loss rate obtained from reference sample.

The addition of second type of additive BSA into the polishing composition provided slightly increased oxide trench loss rates than that from reference sample.

When using D-sorbitol and BSA as dual chemical additives in the same polishing composition, significant oxide trench loss rate reductions were achieved vs reference sample. The dual chemical additives in the same polishing composition afforded the lowest oxide trench loss rate among all tested polishing compositions and reference sample.

The polishing conditions used for patterned wafer polishing were: Dow's IC1010 pad with 3.0 psi down force with table/head speeds at 87/93 rpm, and with insitu conditioning.

Figure 4:
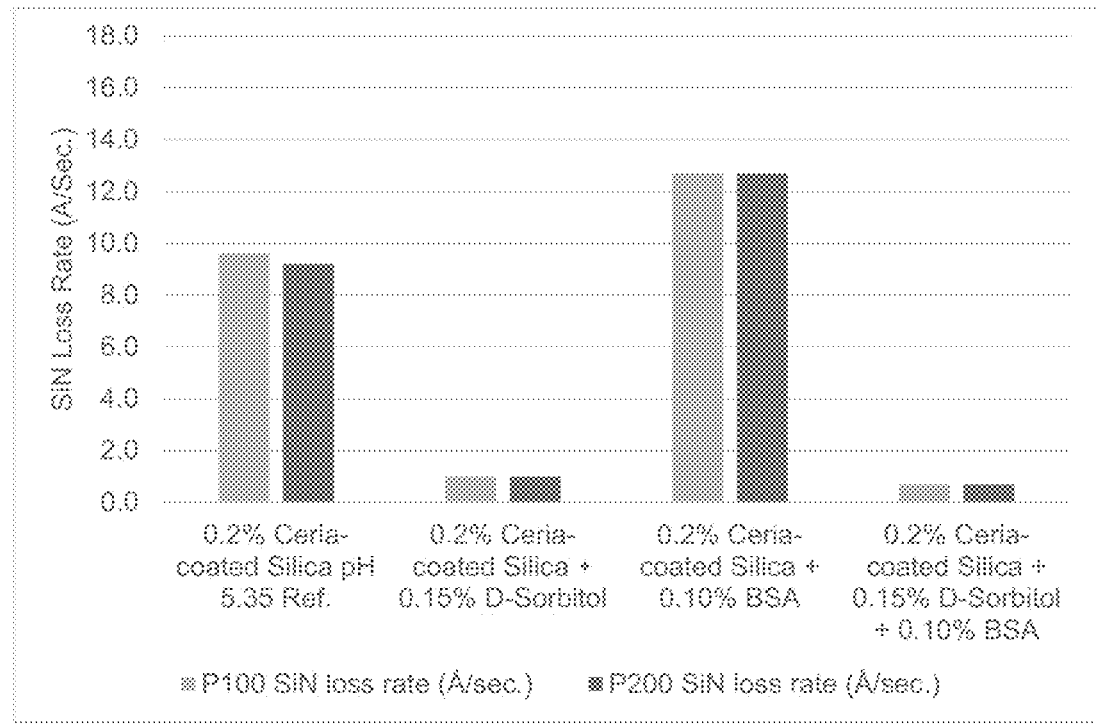
FIG. 4. Effects of D-Sorbitol & BSA Additives on SiN Loss Rates (Å/sec).

The effects of D-sorbitol or benzenesulfonic acid (BSA) or D-sorbitol+BSA on the SiN loss rates (Å/min.) on different sized patterned features were tested and the results were listed in Table 4 and depicted in FIG. 4.

TABLE 4

Effects of D-Sorbitol & BSA Additives on SiN Loss Rates (Å/sec.)

| Compositions | P100 SiN loss rate (Å/sec.) | P200 SiN loss rate (Å/sec.) |
| --- | --- | --- |
| 0.2% Ceria-coated Silica pH 5.35 Ref. | 9.6 | 9.2 |
| 0.2% Ceria-coated Silica + 0.15% D-Sorbitol | 1.0 | 1.0 |
| 0.2% Ceria-coated Silica + 0.10% BSA | 12.7 | 12.7 |
| 0.2% Ceria-coated Silica + 0.15% D-Sorbitol + 0.10% BSA | 0.7 | 0.7 |

As the results shown in Table 4 and FIG. 4, the addition of first type of additive D-sorbitol as the chemical additive in the polishing composition reduced SiN film loss rates significantly while comparing the SiN film loss rates obtained from reference sample.

The addition of second type of additive BSA into the polishing composition provided increased SiN film loss rates than that from reference sample.

When using D-sorbitol and BSA as dual chemical additives in the same polishing composition, significant SiN film loss rate reductions were achieved vs reference sample. The dual chemical additives in the same polishing composition afforded the lowest SiN film loss rate among all tested polishing compositions and reference sample.

The polishing conditions used for patterned wafer polishing were: Dow's IC1010 pad with 3.0 psi down force with table/head speeds at 87/93 rpm, and with insitu conditioning.

Figure 5:
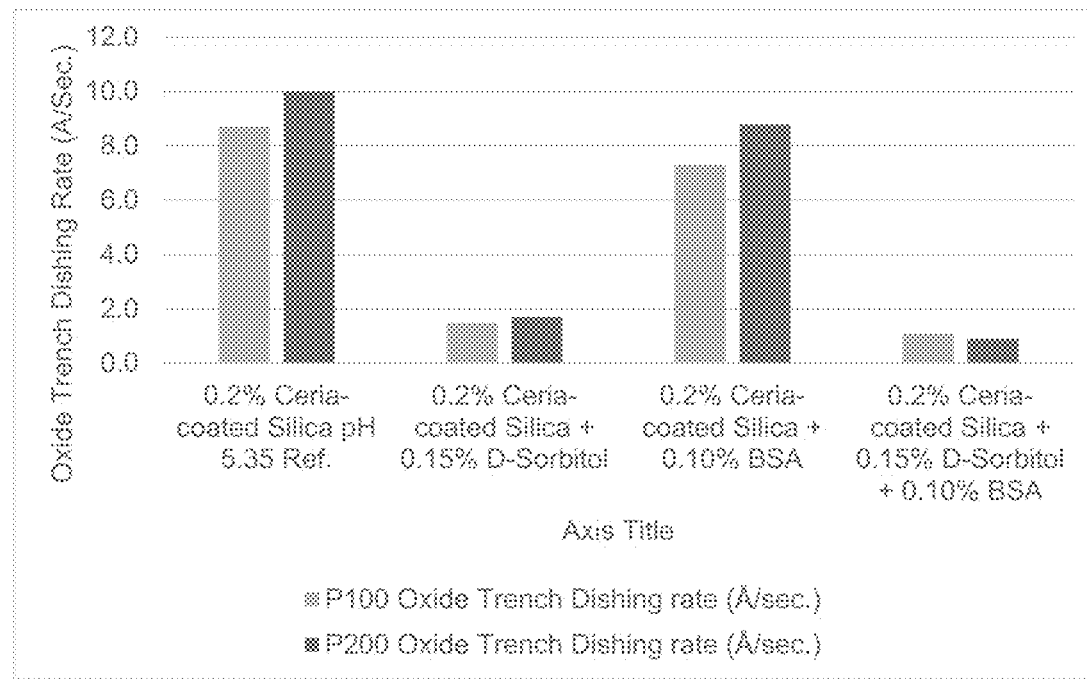
FIG. 5. Effects of D-Sorbitol & BSA Additives on Oxide Trench Dishing Rates (Å/sec).

The effects of D-sorbitol or benzenesulfonic acid (BSA) or D-sorbitol+BSA on oxide trench dishing rates (Å/min.) on different sized patterned features were tested and the results were listed in Table 5 and depicted in FIG. 5.

TABLE 5

Effects of D-Sorbitol & BSA Additives on Oxide Trench Dishing Rates (Å/sec.)

| Compositions | 100 um pitch dishing rate (Å/sec.) | 200 um pitch dishing rate (Å/sec.) |
| --- | --- | --- |
| 0.2% Ceria-coated Silica pH 5.35 Ref. | 8.7 | 10.0 |
| 0.2% Ceria-coated Silica + 0.15% D-Sorbitol | 1.5 | 1.7 |
| 0.2% Ceria-coated Silica + 0.10% BSA | 7.3 | 8.8 |
| 0.2% Ceria-coated Silica + 0.15% D-Sorbitol + 0.10% BSA | 1.1 | 0.9 |

As the results shown in Table 5 and FIG. 5, the addition of first type of additive D-sorbitol as the chemical additive in the polishing composition significantly reduced oxide trench dishing rate while comparing the oxide trench dishing rate obtained from reference sample.

The addition of second type of additive BSA into the polishing composition provided increased oxide trench dishing rate than that from reference sample.

When using D-sorbitol and BSA as dual chemical additives in the polishing composition, significant oxide trench dishing rate reductions were achieved vs reference sample. The dual chemical additives in the same polishing composition afforded the lowest oxide trench dishing rate among all tested polishing compositions and reference sample.

The polishing conditions used for patterned wafer polishing were: Dow's IC1010 pad with 3.0 psi down force with table/head speeds at 87/93 rpm, and with insitu conditioning.

Figure 6:
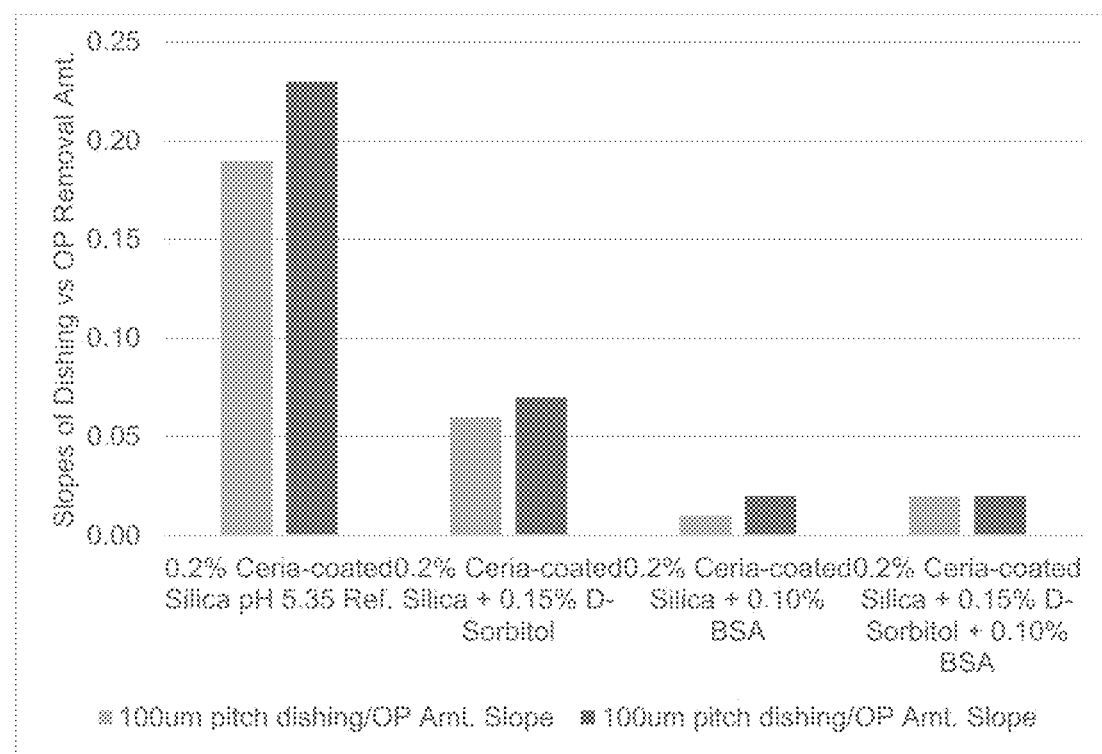
FIG. 6. Effects of D-Sorbitol & BSA on Slopes of Dishing vs. OP Amounts.

The effects of D-sorbitol or benzenesulfonic acid (BSA) or D-sorbitol+BSA on the slopes of trench dishing vs the over polishing removal amounts on different sized patterned features were tested and the results were listed in Table 6 and depicted in FIG. 6.

TABLE 6

Effects of D-Sorbitol & BSA on Slopes of Dishing vs OP Amounts

| Compositions | 100 um pitch dishing/OP Amt. Slope | 200 um pitch dishing/OP Amt. Slope |
| --- | --- | --- |
| 0.2% Ceria-coated Silica pH 5.35 Ref. | 0.19 | 0.23 |
| 0.2% Ceria-coated Silica + 0.15% D-Sorbitol | 0.06 | 0.07 |
| 0.2% Ceria-coated Silica + 0.10% BSA | 0.01 | 0.02 |
| 0.2% Ceria-coated Silica + 0.15% D-Sorbitol + 0.10% BSA | 0.02 | 0.02 |

As the results shown in Table 6 and FIG. 6, the addition of first type of additive D-sorbitol or the second type of additive BSA into the polishing compositions, whether being used alone or used together as chemical additives in the polishing compositions, the slopes of trench dishing vs the over polishing amounts were significant reduced while comparing that obtained from reference sample.

The polishing conditions used for patterned wafer polishing were: Dow's IC1010 pad with 3.0 psi down force with table/head speeds at 87/93 rpm, and with insitu conditioning.

Example 3

In Example 3, the polishing compositions used for polishing tests were shown in Table 7. The reference sample was made by using 0.2 wt. % ceria-coated silica particles, very low concentration of biocide, and deionized water. Maltitol and BSA were used alone or used together at 0.28 wt. %, and 0.10 wt. % respectively in the testing samples.

All reference sample and testing samples had same pH values at around 5.35.

The removal rates (RR at Å/min) for polishing different films were tested. The effects of the chemical additives Maltitol and BSA on the film removal rates and TEOS: SiN selectivity were observed and listed in Table 7 and depicted in FIG. 7.

The polishing parts and conditions were: Dow's IC1010 polishing pad, 3.0 psi DF, ex-situ conditioning and with 87/93 rpm table/head speeds.

TABLE 7

Effects of Maltitol & BSA on Film RR (A/min.) & TEOS:SiN Selectivity

| Compositions | TEOS RR (A/min) | HDP RR (A/min.) | PECVD SiN RR (A/min) | TEOS:SiN Selectivity |
|---|---|---|---|---|
| 0.2% Ceria-coated Silica pH 5.35 Ref. | 3279 | 2718 | 349 | 9.4 |
| 0.2% Ceria-coated Silica + 0.28% Maltitol | 2926 | 2826 | 55 | 53.2 |
| 0.2% Ceria-coated Silica + 0.10% BSA | 3744 | 3497 | 81 | 46.2 |
| 0.2% Ceria-coated Silica + 0.28% Maltitol + 0.10% BSA | 3700 | 3599 | 46 | 80.4 |

Figure 7:
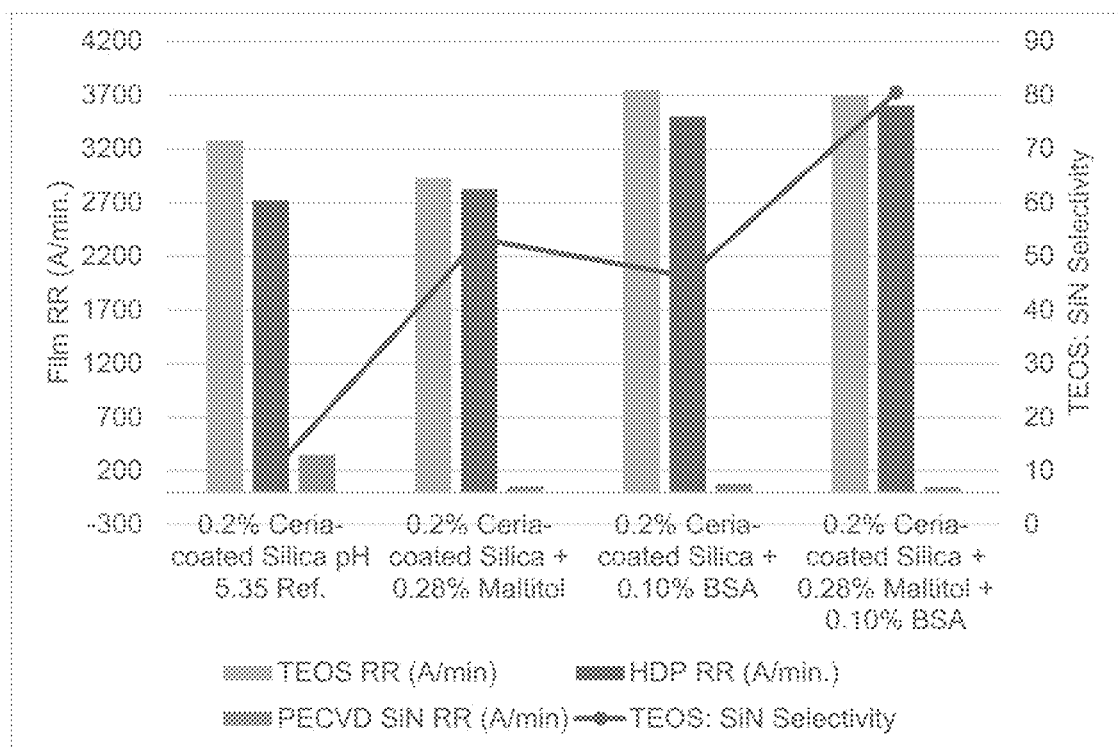
FIG. 7. Effects of Maltitol & BSA on Film RR (Å/min.) & TEOS: SiN Selectivity.

As the results shown in Table 7 and FIG. 7, the addition of maltitol as the first type of chemical additive into the polishing composition effectively suppressed SiN film removal rates, and slightly boosted HDP film removal rates. Thus, the TEOS: SiN selectivity was increased significantly.

The addition of benzenesulfonic acid (BSA) as second type of chemical additive into the polishing composition was not only suppressed SiN film removal rates, but also boosted both TEOS and HDP film removal rates. Thus, further increased TEOS: SiN selectivity was achieved while comparing to the selectivity obtained from reference sample.

When both first type of additive maltitol and second type of additive BSA were added into the same polishing composition, both TEOS and HPD film removal rates were still being boosted and SiN film removal rates were being further suppressed. Thus, the highest TEOS: SiN selectivity was achieved while using both types of additives in the same polishing composition comparing to the TEOS: SiN selectivity obtained while using these additives alone or without using any of them.

While comparing the TEOS: SiN selectivity, the polishing composition using both chemical additives afforded 80:1 selectivity which is much higher than 9:1 selectivity obtained from reference sample.

Example 4

TABLE 8

Effects of Maltitol & BSA Additives on Oxide Trench Dishing (Å) vs OP Times (Sec.)

| Compositions | OP Times (Sec.) | 100 um pitch dishing | 200 um pitch dishing |
|---|---|---|---|
| 0.2% Ceria-coated Silica pH 5.35 Ref. | 0 | 165 | 291 |
| | 60 | 857 | 1096 |
| | 120 | 1207 | 1531 |
| 0.2% Ceria-coated Silica + 0.28% Maltitol | 0 | 316 | 477 |
| | 60 | 402 | 560 |
| | 120 | 468 | 653 |
| 0.2% Ceria-coated Silica + 0.10% BSA | 0 | 343 | 523 |
| | 60 | 1042 | 1306 |
| | 120 | 1220 | 1573 |
| 0.2% Ceria-coated Silica + 0.28% Maltitol + 0.10% BSA | 0 | 287 | 462 |
| | 60 | 357 | 519 |
| | 120 | 398 | 593 |

In Example 4, the polishing compositions used for polishing tests were shown in Table 8. The reference sample was made by using 0.2 wt. % ceria-coated silica particles, very low concentration of biocide and deionized wafer. Maltitol and BSA were used alone or used together at 0.28 wt. %, and 0.10 wt. % respectively in the testing samples.

All reference sample and testing samples had same pH values at around 5.35.

Figure 8:
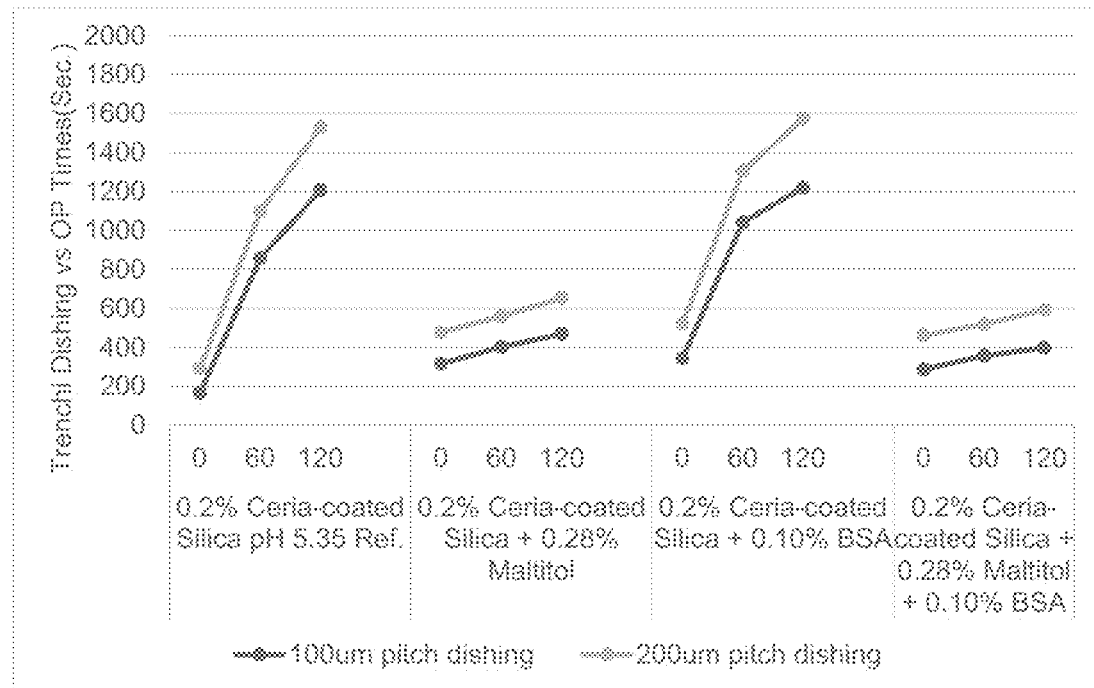
FIG. 8. Effects of Maltitol & BSA Additives on Oxide Trench Dishing (Å) vs. OP Times (Sec).

The effects of maltitol or benzenesulfonic acid (BSA) or maltitol+BSA on the oxide trenching dishing vs different over polishing times were tested and the results were listed in Table 8 and depicted in FIG. 8.

As the results shown in Table 8 and FIG. 8, the addition of first type of additive maltitol as the chemical additive in the polishing compositions reduced oxide trench dishing significantly vs different over polishing times while comparing the oxide trench dishing vs different over polishing times obtained from reference sample.

The addition of second type of additive BSA provided slightly worse oxide trench dishing vs the over polishing times than that from reference sample.

When using maltitol and BSA as dual chemical additives in the same polishing composition, significant oxide trench dishing reductions vs different over polishing times were achieved vs reference sample across different sized patterned features.

Figure 9:
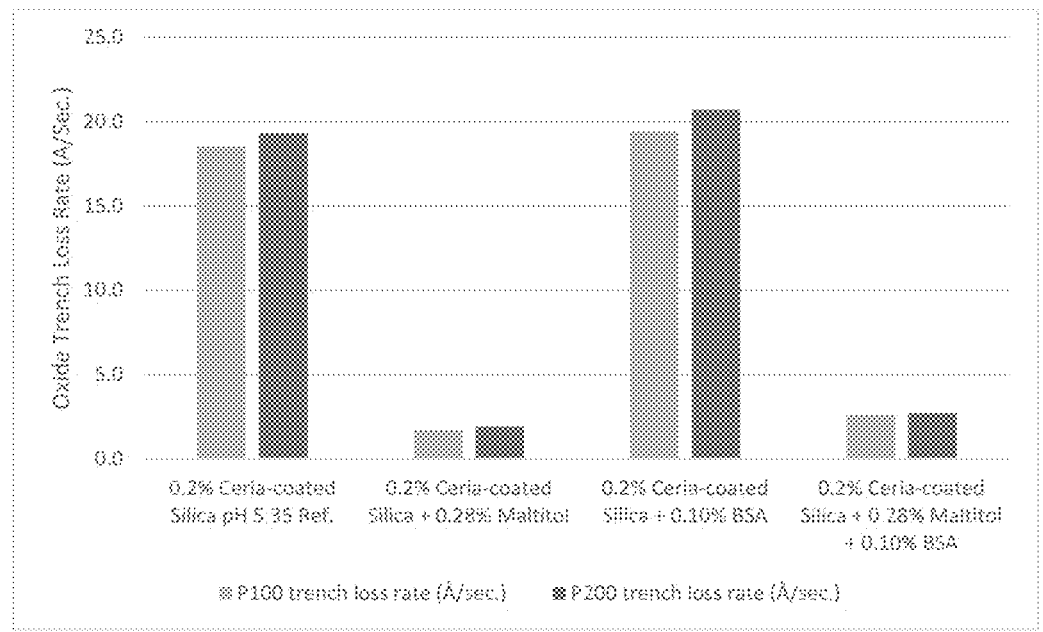
FIG. 9. Effects of Maltitol & BSA Additives on Oxide Trench Loss Rates (Å/sec).

The effects of maltitol or benzenesulfonic acid (BSA) or maltitol+BSA on the oxide trenching loss rates (Å/sec.) were tested and the results were listed in Table 9 and depicted in FIG. 9.

TABLE 9

Effects of Maltitol & BSA Additives on Oxide Trench Loss Rates (Å/sec.)

| Compositions | P100 trench loss rate (Å/sec.) | P200 trench loss rate (Å/sec.) |
|---|---|---|
| 0.2% Ceria-coated Silica pH 5.35 Ref. | 18.5 | 19.3 |
| 0.2% Ceria-coated Silica + 0.28% Maltitol | 1.7 | 1.9 |
| 0.2% Ceria-coated Silica + 0.10% BSA | 19.4 | 20.7 |

TABLE 9-continued

Effects of Maltitol & BSA Additives on Oxide Trench Loss Rates (Å/sec.)

| Compositions | P100 trench loss rate (Å/sec.) | P200 trench loss rate (Å/sec.) |
|---|---|---|
| 0.2% Ceria-coated Silica + 0.28% Maltitol + 0.10% BSA | 2.6 | 2.7 |

As the results shown in Table 9 and FIG. 9, the addition of first type of additive maltitol as the chemical additive in the polishing composition reduced oxide trench loss rates significantly while comparing the oxide trench loss rate obtained from reference sample.

The addition of second type of additive BSA into the polishing composition provided slightly increased oxide trench loss rates than that from reference sample.

When using maltitol and BSA as dual chemical additives in the polishing composition, significant oxide trench loss rate reductions were achieved vs reference sample.

The polishing conditions used for patterned wafer polishing were: Dow's IC1010 pad with 3.0 psi down force with table/head speeds at 87/93 rpm, and with insitu conditioning.

Figure 10:
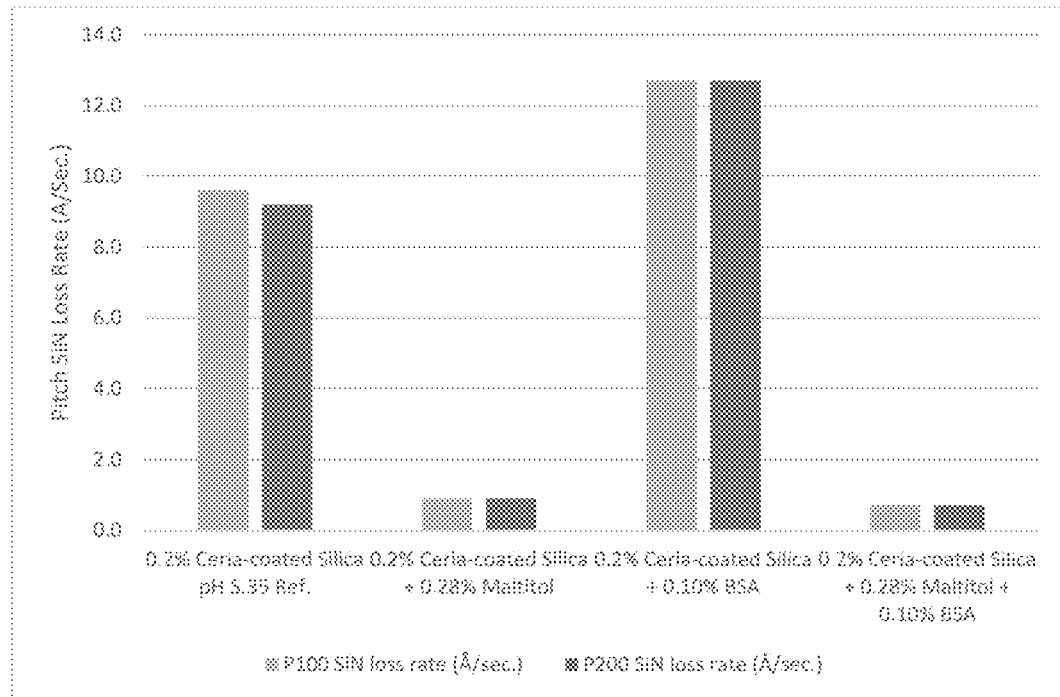
FIG. 10. Effects of Maltitol & BSA Additives on SiN Loss Rates (Å/sec).

The effects of maltitol or benzenesulfonic acid (BSA) or maltitol+BSA on SiN loss rates (Å/min.) on different sized patterned features were tested and the results were listed in Table 10 and depicted in FIG. 10.

TABLE 10

Effects of Maltitol & BSA Additives on SiN Loss Rates (Å/sec.)

| Compositions | P100 SiN loss rate (Å/sec.) | P200 SiN loss rate (Å/sec.) |
|---|---|---|
| 0.2% Ceria-coated Silica pH 5.35 Ref. | 9.6 | 9.2 |
| 0.2% Ceria-coated Silica + 0.28% Maltitol | 0.9 | 0.9 |
| 0.2% Ceria-coated Silica + 0.10% BSA | 12.7 | 12.7 |
| 0.2% Ceria-coated Silica + 0.28% Maltitol + 0.10% BSA | 0.7 | 0.7 |

As the results shown in Table 10 and FIG. 10, the addition of first type of additive maltitol as the chemical additive in the polishing composition reduced SiN film loss rates significantly while comparing the SiN film loss rates obtained from reference sample.

The addition of second type of additive BSA into the polishing composition provided increased SiN film loss rates than that from reference sample.

When using maltitol and BSA as dual chemical additives in the same polishing composition, significant SiN film loss rate reductions were achieved vs reference sample. The dual chemical additives in the same polishing composition afforded the lowest SiN film loss rate among all tested polishing compositions and reference sample.

The polishing conditions used for patterned wafer polishing were: Dow's IC1010 pad with 3.0 psi down force with table/head speeds at 87/93 rpm, and with insitu conditioning.

Figure 11:
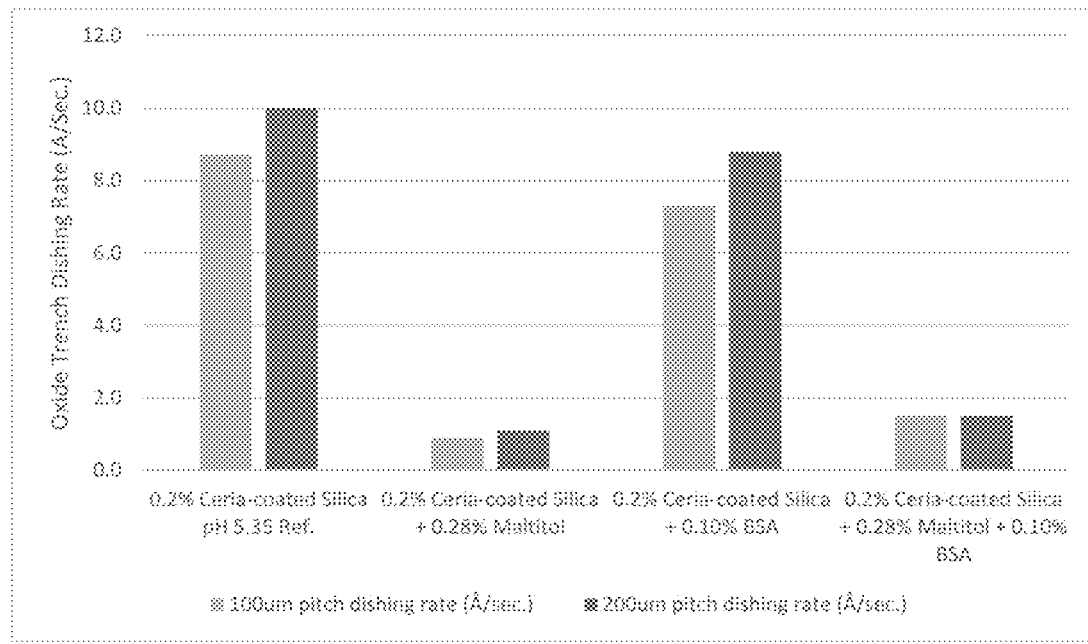
FIG. 11. Effects of Maltitol & BSA Additives on Oxide Trench Dishing Rates (Å/sec).

The effects of maltitol or benzenesulfonic acid (BSA) or maltitol+BSA on oxide trench dishing rates (Å/min.) on different sized patterned features were tested and the results were listed in Table 11 and depicted in FIG. 11.

TABLE 11

Effects of Maltitol & BSA Additives on Oxide Trench Dishing Rates (Å/sec.)

| Compositions | 100 um pitch dishing rate (Å/sec.) | 200 um pitch dishing rate (Å/sec.) |
|---|---|---|
| 0.2% Ceria-coated Silica pH 5.35 Ref. | 8.7 | 10.0 |
| 0.2% Ceria-coated Silica + 0.28% Maltitol | 0.9 | 1.1 |
| 0.2% Ceria-coated Silica + 0.10% BSA | 7.3 | 8.8 |
| 0.2% Ceria-coated Silica + 0.28% Maltitol + 0.10% BSA | 1.5 | 1.5 |

As the results shown in Table 11 and FIG. 11, the addition of first type of additive maltitol as the chemical additive in the polishing composition significantly reduced oxide trench dishing rates while comparing the oxide trench dishing rate obtained from reference sample.

The addition of second type of additive BSA into the polishing composition provided slightly reduced oxide trench dishing rates than that from reference sample.

When using maltitol and BSA as dual chemical additives in the same polishing composition, significant oxide trench dishing rate reductions were achieved vs reference sample.

The polishing conditions used for patterned wafer polishing were: Dow's IC1010 pad with 3.0 psi down force with table/head speeds at 87/93 rpm, and with insitu conditioning.

Figure 12:
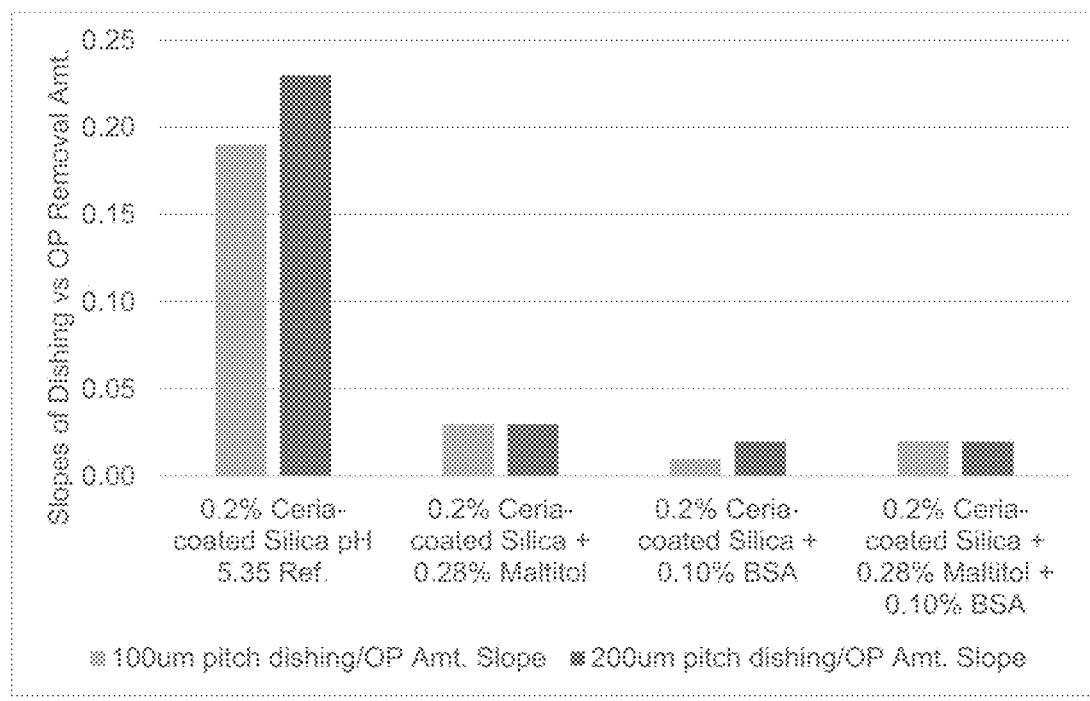
FIG. 12. Effects of Maltitol & BSA on Slopes of Dishing vs OP Amounts.

The effects of maltitol or benzenesulfonic acid (BSA) or maltitol+BSA on the slopes of trench dishing vs the over polishing removal amounts on different sized patterned features were tested and the results were listed in Table 12 and depicted in FIG. 12.

TABLE 12

Effects of Maltitol & BSA on Slopes of Dishing vs OP Amounts

| Compositions | 100 um pitch dishing/OP Amt. Slope | 100 um pitch dishing/OP Amt. Slope |
|---|---|---|
| 0.2% Ceria-coated Silica pH 5.35 Ref. | 0.19 | 0.23 |
| 0.2% Ceria-coated Silica + 0.28% Maltitol | 0.03 | 0.03 |
| 0.2% Ceria-coated Silica + 0.10% BSA | 0.01 | 0.02 |
| 0.2% Ceria-coated Silica + 0.28% Maltitol + 0.10% BSA | 0.02 | 0.02 |

As the results shown in Table 12 and FIG. 12, the addition of first type of additive maltitol or the second type of additive BSA, whether being used alone or used together as chemical additives in the polishing compositions, the slopes of trench dishing vs the over polishing amounts were significant reduced while comparing that obtained from reference sample.

The polishing conditions used for patterned wafer polishing were: Dow's IC1010 pad with 3.0 psi down force with table/head speeds at 87/93 rpm, and with insitu conditioning.

Example 5

As pointed out in previous descriptions, the invented herein the oxide or doped-oxide CMP polishing compositions can be used in wide pH windows to afford high oxide film removal rates, suppressed SiN removal rates, increased Oxide: SiN selectivity, and low oxide trenching dishing.

In Example 5, the invented polishing compositions were tested at acidic pH condition of 4.5.

In Example 5, the polishing compositions used for polishing tests were shown in Table 13. The reference sample was made by using 0.2 wt. % ceria-coated silica particles, very low concentration of biocide, and deionized wafer at pH 4.5.

D-sorbitol or benzenesulfonic acid (BSA) was used alone or used together at 0.15 wt. % or 0.1 wt. % respectively in the testing samples.

All reference sample and testing samples had same pH values at around 4.5.

The effects of D-sorbitol or benzenesulfonic acid (BSA) or D-sorbitol+BSA on various types of film removal rates and TEOS: SiN selectivity were tested, and the results were listed in Table 13.

TABLE 13

Effects of Chemical Additives on Film RR (Å/min.) & TEOS:SiN Selectivity at pH 4.5

| Compositions | TEOS RR (Å/min.) | HDP RR (Å/min.) | SiN RR (Å/min.) | TEOS:SiN Selectivity |
|---|---|---|---|---|
| 0.2% Ceria-coated Silica pH 4.5 | 2807 | 2438 | 336 | 8.4:1 |
| 0.2% Ceria-coated Silica + 0.1% BSA pH 4.5 | 3734 | 3138 | 696 | 5.4:1 |
| 0.2% Ceria-coated Silica + 0.15% D-sorbitol pH 4.5 | 2640 | 2775 | 41 | 64.4:1 |
| 0.2% Ceria-coated Silica + 0.1% BSA pH 4.5 + 0.15% D-sorbitol | 3435 | 3243 | 26 | 132.1:1 |

The polishing step conditions used were: Dow's IC1010 pad at 3.0 psi DF with table/head speed at 87/93 rpm and ex-situ conditioning.

As the results shown in Table 13, the addition of D-sorbitol as chemical additive into the polishing composition effectively suppressed SiN film removal rates, and boosted HDP film removal rates. Thus, the TEOS: SiN selectivity was increased significantly.

The addition of benzenesulfonic acid into the polishing composition as a sole chemical additive was not only boosted SiN film removal rates, but also boosted both TEOS and HDP film removal rates. Thus, further reduced TEOS: SiN selectivity was achieved while comparing the selectivity obtained from reference sample.

When both first type of additive D-sorbitol and second type of additive BSA were added into the same polishing composition at pH 4.5, both TEOS and HPD film removal rates were still being boosted and SiN film removal rates were being further suppressed. Thus, the highest TEOS: SiN selectivity was achieved while using both types of additives in the same polishing composition while comparing the TEOS: SiN selectivity obtained using these additives alone or without using any of them at pH 4.5.

While comparing the TEOS: SiN selectivity, the polishing composition using both chemical additives afforded 132:1 selectivity which is much higher than 8:1 selectivity obtained from reference sample at pH 4.5.

Also, in Example 5, maltitol was used as oxide trenching dishing reducer plus BSA as oxide film removal rate booster in the polishing compositions used for polishing tests were shown in Table 14. The reference sample was made by using 0.2 wt. % ceria-coated silica particles, very low concentration of biocide, and deionized wafer at pH 4.5.

Maltitol was used alone or used together with benzenesulfonic acid (BSA) at 0.28 wt. % or/and 0.1 wt. % respectively in the testing samples at pH 4.5.

All reference sample and testing samples had same pH values at around 4.5.

The effects of maltitol or maltitol plus benzenesulfonic acid (BSA) on the film removal rates and TEOS: SiN selectivity were tested, and the results were listed in Table 14.

TABLE 14

Effects of Chemical Additives on Film RR (Å/min.) & TEOS:SiN Selectivity at pH 4.5.

| Compositions | TEOS RR (Å/min.) | HDP RR (Å/min.) | SiN RR (Å/min.) | TEOS:SiN Selectivity |
|---|---|---|---|---|
| 0.2% Ceria-coated Silica pH 4.5 | 2807 | 2438 | 336 | 8.4:1 |
| 0.2% Ceria-coated Silica + 0.1% BSA pH 4.5 | 3734 | 3138 | 696 | 5.4:1 |
| 0.2% Ceria-coated Silica + 0.28% Maltitol pH 4.5 | 3297 | 3122 | 41 | 80.4:1 |
| 0.2% Ceria-coated Silica + 0.1% BSA + 0.28% Maltito pH 4.5 | 3530 | 3273 | 38 | 92.9:1 |

As the results shown in Table 14, the addition of maltitol as chemical additive into the polishing composition effectively suppressed SiN film removal rates, and boosted HDP film removal rates. Thus, the TEOS: SiN selectivity was increased significantly.

The addition of benzenesulfonic acid into the polishing composition at pH 4.5 as a sole chemical additive was not only boosted SiN film removal rates, but also boosted both TEOS and HDP film removal rates. Thus, further reduced TEOS: SiN selectivity was obtained while comparing the selectivity obtained from reference sample.

When both first type of additive maltitol and second type of additive BSA were added into the same polishing composition at pH 4.5, both TEOS and HPD film removal rates were still being boosted and SiN film removal rates were being further suppressed. Thus, the highest TEOS: SiN selectivity was achieved while using both types of additives in the same polishing composition while comparing the TEOS: SiN selectivity obtained using these additives alone or without using any of them at pH 4.5.

While comparing the TEOS: SiN selectivity, the polishing composition using both chemical additives afforded 93:1 selectivity which is much higher than 8:1 selectivity obtained from reference sample at pH 4.5.

In Example 5, the effects of D-sorbitol or benzenesulfonic acid (BSA) or D-sorbitol+BSA at pH 4.5 on the oxide trenching dishing vs different over polishing times were tested and the results were listed in Table 15.

TABLE 15

Effects of D-Sorbitol & BSA Additives on Oxide Trench Dishing (Å) vs OP Times (Sec.) at pH 4.5

| Compositions | OP Times (Sec.) | 100 μm Pitch Dishing (Å) | 200 μm Pitch Dishing (Å) |
|---|---|---|---|
| 0.2% Ceria-coated Silica pH 4.5 | 0 | 245 | 372 |
|  | 60 | 671 | 814 |
|  | 120 | 1053 | 1227 |
| 0.2% Ceria-coated Silica + 0.1% BSA pH 4.5 | 0 | 126 | 176 |
|  | 60 | 933 | 1110 |
|  | 120 | 1231 | 1538 |
| 0.2% Ceria-coated Silica + 0.15% D-sorbitol pH 4.5 | 0 | 86 | 251 |
|  | 60 | 174 | 369 |
|  | 120 | 286 | 510 |
| 0.2% Ceria-coated Silica + 0.15% D-sorbitol pH 4.5 | 0 | 187 | 264 |
|  | 60 | 247 | 392 |
|  | 120 | 319 | 498 |

As the results shown in Table 15, the addition of first type of additive D-sorbitol at pH 4.5 as the chemical additive in the polishing composition significantly reduced oxide trench dishing vs different over polishing times while comparing the oxide trench dishing obtained vs different over polishing times obtained from reference sample.

The addition of second type of additive BSA at pH 4.5 provided worse oxide trench dishing vs over polishing times than that from reference sample.

When using D-sorbitol and BSA as dual chemical additives in the same polishing composition at pH 4.5, significant oxide trench dishing reductions vs over polishing times were achieved vs reference sample.

The dual chemical additives based polishing composition provided more stable over polishing window at pH 4.5 while comparing that using each of these two additives alone.

In Example 5, the effects of maltitol or benzenesulfonic acid (BSA) or maltitol+BSA at pH 4.5 on the oxide trenching dishing vs different over polishing times were tested and the results were listed in Table 16.

TABLE 16

Effects of Maltitol & BSA Additives on Oxide Trench Dishing (Å) vs OP Times (Sec.) at pH 4.5

| Compositions | OP Times (Sec.) | 100 μm Pitch Dishing (Å) | 200 μm Pitch Dishing (Å) |
|---|---|---|---|
| 0.2% Ceria-coated Silica pH 4.5 | 0 | 245 | 372 |
|  | 60 | 671 | 814 |
|  | 120 | 1053 | 1227 |
| 0.2% Ceria-coated Silica + 0.1% BSA pH 4.5 | 0 | 126 | 176 |
|  | 60 | 933 | 1110 |
|  | 120 | 1231 | 1538 |
| 0.2% Ceria-coated Silica + 0.28% Maltitol pH 4.5 | 0 | 147 | 264 |
|  | 60 | 244 | 392 |
|  | 120 | 339 | 498 |
| 0.2% Ceria-coated Silica + 0.28% Maltitol pH 4.5 | 0 | 160 | 265 |
|  | 60 | 248 | 364 |
|  | 120 | 351 | 481 |

As the results shown in Table 16, the addition of first type of additive maltitol at pH 4.5 as the chemical additive in the polishing composition significantly reduced oxide trench dishing vs different over polishing times while comparing the oxide trench dishing vs different over polishing times obtained from reference sample.

The addition of second type of additive BSA at pH 4.5 provided worse oxide trench dishing vs over polishing times than that from reference sample.

When using maltitol and BSA as dual chemical additives in the same polishing composition at pH 4.5, significant oxide trench dishing reductions vs over polishing times were achieved vs reference sample.

The dual chemical additives based polishing composition provided more stable over polishing window at pH 4.5 while comparing that using each of these two additives alone.

In Example 5, the effects of D-sorbitol or benzenesulfonic acid (BSA) or D-sorbitol+BSA at pH 4.5 on the oxide trenching loss rates (Å/sec.) were tested and the results were listed in Table 17.

TABLE 17

Effects of D-sorbitol & BSA Additives at pH 4.5 on Oxide Trench Loss Rates (Å/sec.)

| Compositions | P100 Trench Loss Rate (Å/sec.) | P200 Trench Loss Rate (Å/sec.) |
|---|---|---|
| 0.2% Ceria-coated Silica pH 4.5 | 13.7 | 13.6 |
| 0.2% Ceria-coated Silica + 0.1% BSA pH 4.5 | 21.8 | 23 |
| 0.2% Ceria-coated Silica + 0.15% D-sorbitol pH 4.5 | 3.1 | 4.1 |
| 0.2% Ceria-coated Silica + 0.1% BSA pH 4.5 + 0.15% D-sorbitol | 1.8 | 1.9 |

As the results shown in Table 17, the addition of first type of additive D-sorbitol as the chemical additive at pH 4.5 in the polishing composition reduced oxide trench loss rates significantly while comparing the oxide trench loss rate obtained from reference sample.

The addition of second type of additive BSA at pH 4.5 into the polishing composition provided largely increased oxide trench loss rates than that from reference sample.

When using D-sorbitol and BSA as dual chemical additives in the same polishing composition at pH 4.5, significant oxide trench loss rate reductions were achieved vs reference sample. The dual chemical additives in the same polishing composition afforded the lowest oxide trench loss rate among all tested polishing compositions and reference sample.

The polishing conditions used for patterned wafer polishing were: Dow's IC1010 pad with 3.0 psi down force with table/head speeds at 87/93 rpm, and with insitu conditioning.

In Example 5, the effects of maltitol or benzenesulfonic acid (BSA) or maltitol+BSA at pH 4.5 on the oxide trenching loss rates (Å/sec.) were tested and the results were listed in Table 18.

TABLE 18

Effects of Maltitol & BSA Additives at pH 4.5 on Oxide Trench Loss Rates (Å/sec.)

| Compositions | P100 Trench Loss Rate (Å/sec.) | P200 Trench Loss Rate (Å/sec.) |
|---|---|---|
| 0.2% Ceria-coated Silica pH 4.5 | 13.7 | 13.6 |
| 0.2% Ceria-coated Silica + 0.1% BSA pH 4.5 | 21.8 | 23 |
| 0.2% Ceria-coated Silica + 0.28% Maltitol pH 4.5 | 2.6 | 3.0 |
| 0.2% Ceria-coated Silica + 0.1% BSA + 0.28% Maltito pH 4.5 | 2.6 | 2.7 |

As the results shown in Table 18, the addition of first type of additive maltitol as the chemical additive at pH 4.5 in the polishing composition reduced oxide trench loss rates significantly while comparing the oxide trench loss rate obtained from reference sample.

The addition of second type of additive BSA at pH 4.5 into the polishing composition provided largely increased oxide trench loss rates than that from reference sample.

When using maltitol and BSA as dual chemical additives in the same polishing composition at pH 4.5, significant oxide trench loss rate reductions were achieved vs reference sample. The dual chemical additives in the same polishing composition afforded the lowest oxide trench loss rate among all tested polishing compositions and reference sample.

The polishing conditions used for patterned wafer polishing were: Dow's IC1010 pad with 3.0 psi down force with table/head speeds at 87/93 rpm, and with insitu conditioning.

In Example 5, the effects of D-sorbitol or benzenesulfonic acid (BSA) or D-sorbitol+BSA at pH 4.5 on the SiN loss rates (Å/min.) on different sized patterned features were tested and the results were listed in Table 19.

TABLE 19

Effects of D-Sorbitol & BSA Additives at pH 4.5 on SiN Loss Rates (Å/sec.)

| Compositions | P100 SiN Loss Rate (Å/sec.) | P200 SiN Loss Rate (Å/sec.) |
|---|---|---|
| 0.2% Ceria-coated Silica pH 4.5 | 6.3 | 6.0 |
| 0.2% Ceria-coated Silica + 0.1% BSA pH 4.5 | 12.1 | 11.7 |
| 0.2% Ceria-coated Silica + 0.15% D-sorbitol pH 4.5 | 1.1 | 1.3 |
| 0.2% Ceria-coated Silica + 0.1% BSA pH 4.5 + 0.15% D-sorbitol | 0.6 | 0.7 |

As the results shown in Table 19, the addition of first type of additive D-sorbitol as the chemical additive in the polishing composition at pH 4.5 reduced SiN film loss rates significantly while comparing the SiN film loss rates obtained from reference sample.

The addition of second type of additive BSA into the polishing composition provided increased SiN film loss rates than that from reference sample.

When using D-sorbitol and BSA as dual chemical additives in the same polishing composition at pH 4.5, significant SiN film loss rate reductions were achieved vs reference sample. The dual chemical additives in the same polishing composition afforded the lowest SiN film loss rate among all tested polishing compositions and reference sample.

In Example 5, the effects of D-sorbitol or benzenesulfonic acid (BSA) or D-sorbitol+BSA at pH 4.5 on the oxide trench dishing rates (Å/min.) on different sized patterned features were tested and the results were listed in Table 20.

TABLE 20

Effects of D-Sorbitol & BSA Additives at pH 4.5 on Oxide Trench Dishing Rates (Å/sec.)

| Compositions | P100 Oxide Trench Dishing Rate (Å/sec.) | P200 Oxide Trench Dishing Rate (Å/sec.) |
|---|---|---|
| 0.2% Ceria-coated Silica pH 4.5 | 6.7 | 7.1 |
| 0.2% Ceria-coated Silica + 0.1% BSA pH 4.5 | 9.2 | 11.4 |
| 0.2% Ceria-coated Silica + 0.15% D-sorbitol pH 4.5 | 1.7 | 2.2 |
| 0.2% Ceria-coated Silica + 0.1% BSA + 0.15% D-sorbitol pH 4.5l | 1.1 | 1.2 |

As the results shown in Table 20, the addition of first type of additive D-sorbitol at pH 4.5 as the chemical additive in the polishing composition significantly reduced oxide trench dishing rate while comparing the oxide trench dishing rate obtained from reference sample.

The addition of second type of additive BSA at pH 4.5 into the polishing composition provided largely oxide trench dishing rate than that from reference sample.

When using D-sorbitol and BSA as dual chemical additives at pH 4.5 in the polishing composition, significant oxide trench dishing rate reductions were achieved vs reference sample. The dual chemical additives in the same polishing composition afforded the lowest oxide trench dishing rate among all tested polishing compositions and reference sample.

The polishing conditions used for patterned wafer polishing were: Dow's IC1010 pad with 3.0 psi down force with table/head speeds at 87/93 rpm, and with insitu conditioning.

In Example 5, the effects of D-sorbitol or benzenesulfonic acid (BSA) or D-sorbitol+BSA at pH 4.5 on the slopes of trench dishing vs the over polishing removal amounts on different sized patterned features were tested and the results were listed in Table 21.

TABLE 21

Effects of D-Sorbitol & BSA at pH 4.5 on Slopes of Dishing vs OP Amounts

| Compositions | P100 Dishing/OP Amt. Slope | P200 Dishing/OP Amt. Slope |
|---|---|---|
| 0.2% Ceria-coated Silica pH 4.5 | 0.17 | 0.18 |
| 0.2% Ceria-coated Silica + 0.1% BSA pH 4.5 | 0.18 | 0.22 |
| 0.2% Ceria-coated Silica + 0.15% D-sorbitol pH 4.5 | 0.04 | 0.05 |
| 0.2% Ceria-coated Silica + 0.1% BSA + 0.15% D-sorbitol pH 4.5 | 0.02 | 0.02 |

As the results shown in Table 21, the addition of first type of additive D-sorbitol at pH 4.5 into the polishing composition as chemical additive in the polishing compositions, the slopes of trench dishing vs the over polishing amounts were significant reduced while comparing that obtained from reference sample.

The addition of second type of additive BSA at pH 4.5 into the polishing composition as chemical additive in the polishing compositions, the slopes of trench dishing vs the over polishing amounts were increased while comparing that obtained from reference sample.

When using D-sorbitol and BSA as dual chemical additives at pH 4.5 in the polishing composition, the slopes of oxide trench dishing vs over polishing amount of oxide film were significantly reduced vs that from reference sample.

The dual chemical additives in the same polishing composition afforded the lowest slope of oxide dishing vs over polishing amount of oxide film among all tested polishing compositions and reference sample.

The polishing conditions used for patterned wafer polishing were: Dow's IC1010 pad with 3.0 psi down force with table/head speeds at 87/93 rpm, and with insitu conditioning.

Example 6

As pointed out in previous descriptions, the invented herein the oxide or doped-oxide CMP polishing compositions can be used in wide pH windows to afford high oxide film removal rates, suppressed SiN removal rates, increased Oxide: SiN selectivity, and low oxide trenching dishing.

In Example 6, the invented polishing compositions were tested at alkaline pH condition of 7.5.

In Example 6, the polishing compositions used for polishing tests were shown in Table 22. The reference sample was made by using 0.2 wt. % ceria-coated silica particles, very low concentration of biocide, and deionized wafer at pH 7.5.

D-sorbitol or benzenesulfonic acid (BSA) was used alone or used together at 0.15 wt. % or/and 0.1 wt. % respectively in the testing samples.

All reference sample and testing samples had same pH values at around 7.5.

The effects of D-sorbitol or benzenesulfonic acid (BSA) or D-sorbitol+BSA on various types of film removal rates and TEOS: SiN selectivity at pH 7.5 were tested and the results were listed in Table 22.

TABLE 22

Effects of Chemical Additives on Film RR (Å/min.) & TEOS:SiN Selectivity at pH 7.5

| Compositions | TEOS RR (Å/min.) | HDP RR (Å/min.) | SiN RR (Å/min.) | TEOS:SiN Selectivity |
|---|---|---|---|---|
| 0.2% Ceria-coated Silica pH 7.5 | 2513 | 2188 | 313 | 8.0:1 |
| 0.2% Ceria-coated Silica + 0.1% BSA pH 7.5 | 2955 | 2610 | 658 | 4.5:1 |
| 0.2% Ceria-coated Silica + 0.15% D-sorbitol pH 7.5 | 2067 | 1834 | 41 | 50.4:1 |
| 0.2% Ceria-coated Silica + 0.1% BSA + 0.15% D-sorbitol pH 7.5 | 3012 | 2767 | 34 | 88.6:1 |

The polishing step conditions used were: Dow's IC1010 pad at 3.0 psi DF with table/head speed at 87/93 rpm and ex-situ conditioning.

As the results shown in Table 22, the addition of D-sorbitol as chemical additive into the polishing composition at pH 7.5 effectively suppressed SiN film removal rates. Thus, the TEOS: SiN selectivity was increased significantly.

The addition of benzenesulfonic acid into the polishing composition at pH 7.5 as a sole chemical additive was not only boosted SiN film removal rates, but also boosted both TEOS and HDP film removal rates. Thus, further reduced TEOS: SiN selectivity was observed while comparing the selectivity obtained from reference sample.

When both first type of additive D-sorbitol and second type of additive BSA were added into the same polishing composition at pH 7.5, both TEOS and HPD film removal rates were still being boosted and SiN film removal rates were being further suppressed. Thus, the highest TEOS: SiN selectivity was achieved while using both types of additives in the same polishing composition while comparing the TEOS: SiN selectivity obtained using these additives alone or without using any of them at pH 7.5.

While comparing the TEOS: SiN selectivity, the polishing composition using both chemical additives afforded 89:1 selectivity which is much higher than 8:1 selectivity obtained from reference sample at pH 7.5.

Also, in Example 6, maltitol was used as oxide trenching dishing reducer plus BSA as oxide film removal rate booster in the polishing compositions at pH 7.5 used for polishing tests were shown in Table 23. The reference sample was made by using 0.2 wt. % ceria-coated silica particles, very low concentration of biocide, and deionized wafer at pH 7.5.

Maltitol was used alone or used together with benzenesulfonic acid (BSA) at 0.28 wt. % or/and 0.1 wt. % respectively in the testing samples.

All reference sample and testing samples had same pH values at around 7.5.

The effects of maltitol or BSA or maltitol plus benzenesulfonic acid (BSA) on the film removal rates and TEOS: SiN selectivity were tested, and the results were listed in Table 23.

TABLE 23

Effects of Chemical Additives on Film RR (Å/min.) & TEOS:SiN Selectivity at pH 7.5

| Compositions | TEOS RR (Å/min.) | HDP RR (Å/min.) | SiN RR (Å/min.) | TEOS:SiN Selectivity |
|---|---|---|---|---|
| 0.2% Ceria-coated Silica pH 7.5 | 2513 | 2188 | 313 | 8.0:1 |
| 0.2% Ceria-coated Silica + 0.1% BSA pH 7.5 | 2955 | 2610 | 658 | 4.5:1 |
| 0.2% Ceria-coated Silica + 0.28% Maltitol pH 7.5 | 2360 | 2293 | 40 | 59.0:1 |
| 0.2% Ceria-coated Silica + 0.1% BSA + 0.28% Maltito pH 7.5 | 2918 | 2653 | 35 | 83.4:1 |

As the results shown in Table 23, the addition of maltitol as chemical additive into the polishing composition at pH 7.5 effectively suppressed SiN film removal rates. Thus, the TEOS: SiN selectivity was increased significantly.

The addition of benzenesulfonic acid into the polishing composition at pH 7.5 as a sole chemical additive was not only boosted SiN film removal rates, but also boosted both TEOS and HDP film removal rates. Thus, further reduced TEOS: SiN selectivity was observed while comparing the selectivity obtained from reference sample.

When both first type of additive maltitol and second type of additive BSA were added into the same polishing composition at pH 7.5, both TEOS and HPD film removal rates were still being boosted and SiN film removal rates were being further suppressed. Thus, the highest TEOS: SiN selectivity was achieved while using both types of additives in the same polishing composition at pH 7.5 while comparing the TEOS: SiN selectivity obtained using these additives alone or without using any of them at pH 7.5.

While comparing the TEOS: SiN selectivity, the polishing composition using both chemical additives afforded 83:1 selectivity which is much higher than 8:1 selectivity obtained from reference sample at pH 7.5.

In Example 6, the effects of D-sorbitol or benzenesulfonic acid (BSA) or D-sorbitol+BSA at pH 7.5 on the oxide trenching dishing vs different over polishing times were tested and the results were listed in Table 24.

TABLE 24

Effects of D-Sorbitol & BSA Additives on Oxide Trench Dishing (Å) vs OP Times (Sec.) at pH 7.5

| Compositions | OP Times (Sec.) | 100 μm Pitch Dishing (Å) | 200 μm Pitch Dishing (Å) |
|---|---|---|---|
| 0.2% Ceria-coated Silica pH 7.5 | 0 | 211 | 305 |
|  | 60 | 699 | 811 |
|  | 120 | 1072 | 1234 |
| 0.2% Ceria-coated Silica + 0.1% BSA pH 7.5 | 0 | 299 | 441 |
|  | 60 | 1078 | 1266 |
|  | 120 | 1309 | 1607 |
| 0.2% Ceria-coated Silica + 0.15% D-sorbitol pH 7.5 | 0 | 191 | 318 |
|  | 60 | 323 | 468 |
|  | 120 | 473 | 630 |
| 0.2% Ceria-coated Silica + 0.15% D-sorbitol pH 7.5 | 0 | 220 | 369 |
|  | 60 | 311 | 450 |
|  | 120 | 414 | 558 |

As the results shown in Table 24, the addition of first type of additive D-sorbitol at pH 7.5 as the chemical additive in the polishing composition significantly reduced oxide trench dishing vs different over polishing times while comparing the oxide trench dishing vs different over polishing times obtained from reference sample.

The addition of second type of additive BSA at pH 7.5 provided worse oxide trench dishing vs over polishing times than that from reference sample.

When using D-sorbitol and BSA as dual chemical additives in the same polishing composition at pH 7.5, significant oxide trench dishing reductions vs over polishing times were achieved vs reference sample.

The dual chemical additives based polishing composition provided more stable over polishing window at pH 7.5 while comparing that using each of these two additives alone.

In Example 6, the effects of maltitol or benzenesulfonic acid (BSA) or maltitol+BSA at pH 7.5 on the oxide trenching dishing vs different over polishing times were tested and the results were listed in Table 25.

TABLE 25

Effects of Maltitol & BSA Additives on Oxide Trench Dishing (Å) vs OP Times (Sec.) at pH 7.5

| Compositions | OP Times (Sec.) | 100 μm Pitch Dishing (Å) | 200 μm Pitch Dishing (Å) |
|---|---|---|---|
| 0.2% Ceria-coated Silica pH 7.5 | 0 | 211 | 305 |
|  | 60 | 699 | 811 |
|  | 120 | 1072 | 1234 |
| 0.2% Ceria-coated Silica + 0.1% BSA pH 7.5 | 0 | 299 | 441 |
|  | 60 | 1078 | 1266 |
|  | 120 | 1309 | 1607 |
| 0.2% Ceria-coated Silica + 0.28% Maltitol pH 7.5 | 0 | 159 | 358 |
|  | 60 | 310 | 531 |
|  | 120 | 472 | 746 |
| 0.2% Ceria-coated Silica + 0.28% Maltitol pH 7.5 | 0 | 86 | 282 |
|  | 60 | 194 | 431 |
|  | 120 | 331 | 576 |

As the results shown in Table 25, the addition of first type of additive maltitol at pH 7.5 as the chemical additive in the polishing composition significantly reduced oxide trench dishing vs different over polishing times while comparing the oxide trench dishing obtained vs different over polishing times obtained from reference sample.

The addition of second type of additive BSA at pH 7.5 provided worse oxide trench dishing vs over polishing times than that from reference sample.

When using maltitol and BSA as dual chemical additives in the same polishing composition at pH 7.5, significant oxide trench dishing reductions vs over polishing times were achieved vs reference sample.

The dual chemical additives based polishing composition provided more stable over polishing window at pH 7.5 while comparing that using each of these two additives alone.

In Example 6, the effects of D-sorbitol or benzenesulfonic acid (BSA) or D-sorbitol+BSA at pH 7.5 on the oxide trenching loss rates (Å/sec.) were tested and the results were listed in Table 26.

TABLE 26

Effects of D-sorbitol & BSA Additives at pH 7.5 on Oxide Trench Loss Rates (Å/sec.)

| Compositions | P100 Trench Loss Rate (Å/sec.) | P200 Trench Loss Rate (Å/sec.) |
|---|---|---|
| 0.2% Ceria-coated Silica pH 7.5 | 14.1 | 14.2 |
| 0.2% Ceria-coated Silica + 0.1% BSA pH 7.5 | 21.4 | 22.2 |
| 0.2% Ceria-coated Silica + 0.15% D-sorbitol pH 7.5 | 3.7 | 3.9 |
| 0.2% Ceria-coated Silica + 0.1% BSA + 0.15% D-sorbitol pH 7.5 | 2.5 | 2.5 |

As the results shown in Table 26, the addition of first type of additive D-sorbitol as the chemical additive at pH 7.5 in the polishing composition reduced oxide trench loss rates significantly while comparing the oxide trench loss rate obtained from reference sample.

The addition of second type of additive BSA at pH 7.5 into the polishing composition provided significantly increased oxide trench loss rates than that from reference sample.

When using D-sorbitol and BSA as dual chemical additives in the same polishing composition at pH 7.5, significant oxide trench loss rate reductions were achieved vs reference sample. The dual chemical additives in the same polishing composition afforded the lowest oxide trench loss rate among all tested polishing compositions and reference sample at pH 7.5.

The polishing conditions used for patterned wafer polishing were: Dow's IC1010 pad with 3.0 psi down force with table/head speeds at 87/93 rpm, and with insitu conditioning.

In Example 6, the effects of maltitol or benzenesulfonic acid (BSA) or maltitol+BSA at pH 7.5 on the oxide trenching loss rates (Å/sec.) were tested and the results were listed in Table 27.

TABLE 27

Effects of Maltitol & BSA Additives at pH 7.5 on Oxide Trench Loss Rates (Å/sec.)

| Compositions | P100 Trench Loss Rate (Å/sec.) | P200 Trench Loss Rate (Å/sec.) |
|---|---|---|
| 0.2% Ceria-coated Silica pH 7.5 | 14.1 | 14.2 |
| 0.2% Ceria-coated Silica + 0.1% BSA pH 7.5 | 21.4 | 22.2 |
| 0.2% Ceria-coated Silica + 0.28% Maltitol pH 7.5 | 3.7 | 4.6 |
| 0.2% Ceria-coated Silica + 0.1% BSA + 0.28% Maltito pH 7.5 | 3.1 | 3.8 |

As the results shown in Table 27, the addition of first type of additive maltitol as the chemical additive at pH 7.5 in the polishing composition reduced oxide trench loss rates significantly while comparing the oxide trench loss rate obtained from reference sample.

The addition of second type of additive BSA at pH 7.5 into the polishing composition provided significantly increased oxide trench loss rates than that from reference sample.

When using maltitol and BSA as dual chemical additives in the same polishing composition at pH 7.5, significant oxide trench loss rate reductions were achieved vs reference sample. The dual chemical additives in the same polishing composition afforded the lowest oxide trench loss rate among all tested polishing compositions and reference sample at pH 7.5.

The polishing conditions used for patterned wafer polishing were: Dow's IC1010 pad with 3.0 psi down force with table/head speeds at 87/93 rpm, and with insitu conditioning.

In Example 6, the effects of D-sorbitol or benzenesulfonic acid (BSA) or D-sorbitol+BSA at pH 7.5 on the SiN loss rates (Å/min.) on different sized patterned features were tested and the results were listed in Table 28.

TABLE 28

Effects of D-Sorbitol & BSA Additives at pH 7.5 on SiN Loss Rates (Å/sec.)

| Compositions | P100 SiN Loss Rate (Å/sec.) | P200 SiN Loss Rate (Å/sec.) |
| --- | --- | --- |
| 0.2% Ceria-coated Silica pH 7.5 | 6.6 | 6.2 |
| 0.2% Ceria-coated Silica + 0.1% BSA pH 7.5 | 12.7 | 12.5 |
| 0.2% Ceria-coated Silica + 0.15% D-sorbitol pH 7.5 | 1.1 | 1.1 |
| 0.2% Ceria-coated Silica + 0.1% BSA + 0.15% D-sorbitol pH 7.5 | 0.9 | 0.9 |

As the results shown in Table 28, the addition of first type of additive D-sorbitol as the chemical additive in the polishing composition at pH 7.5 reduced SiN film loss rates significantly while comparing the SiN film loss rates obtained from reference sample.

The addition of second type of additive BSA into the polishing composition at pH 7.5 provided increased SiN film loss rates than that from reference sample.

When using D-sorbitol and BSA as dual chemical additives in the same polishing composition at pH 7.5, significant SiN film loss rate reductions were achieved vs reference sample. The dual chemical additives in the same polishing composition afforded the lowest SiN film loss rate among all tested polishing compositions and reference sample.

In Example 6, the effects of D-sorbitol or benzenesulfonic acid (BSA) or D-sorbitol+BSA at pH 7.5 on the oxide trench dishing rates (Å/min.) on different sized patterned features were tested and the results were listed in Table 29.

TABLE 29

Effects of D-Sorbitol & BSA Additives at pH 7.5 on Oxide Trench Dishing Rates (Å/sec.)

| Compositions | P100 Oxide Trench Dishing Rate (Å/sec.) | P200 Oxide Trench Dishing Rate (Å/sec.) |
| --- | --- | --- |
| 0.2% Ceria-coated Silica pH 7.5 | 7.2 | 7.7 |
| 0.2% Ceria-coated Silica + 0.1% BSA pH 7.5 | 8.4 | 9.7 |
| 0.2% Ceria-coated Silica + 0.15% D-sorbitol pH 7.5 | 2.4 | 2.6 |
| 0.2% Ceria-coated Silica + 0.1% BSA + 0.15% D-sorbitol pH 7.5 | 1.6 | 1.6 |

As the results shown in Table 29, the addition of first type of additive D-sorbitol at pH 7.5 as the chemical additive in the polishing composition significantly reduced oxide trench dishing rate while comparing the oxide trench dishing rate obtained from reference sample.

The addition of second type of additive BSA at pH 7.5 into the polishing composition provided increased oxide trench dishing rate than that from reference sample.

When using D-sorbitol and BSA as dual chemical additives at pH 7.5 in the polishing composition, significant oxide trench dishing rate reductions were achieved vs reference sample. The dual chemical additives in the same polishing composition at pH 7.5 afforded the lowest oxide trench dishing rate among all tested polishing compositions and reference sample.

The polishing conditions used for patterned wafer polishing were: Dow's IC1010 pad with 3.0 psi down force with table/head speeds at 87/93 rpm, and with insitu conditioning.

In Example 6, the effects of D-sorbitol or benzenesulfonic acid (BSA) or D-sorbitol+BSA at pH 7.5 on the slopes of trench dishing vs the over polishing removal amounts on different sized patterned features were tested and the results were listed in Table 30.

TABLE 30

Effects of D-Sorbitol & BSA at pH 7.5 on Slopes of Dishing vs OP Amounts

| Compositions | P100 Dishing/OP Amt. Slope | P200 Dishing/OP Amt. Slope |
| --- | --- | --- |
| 0.2% Ceria-coated Silica pH 7.5 | 0.23 | 0.25 |
| 0.2% Ceria-coated Silica + 0.1% BSA pH 7.5 | 0.19 | 0.22 |
| 0.2% Ceria-coated Silica + 0.15% D-sorbitol pH 7.5 | 0.06 | 0.07 |
| 0.2% Ceria-coated Silica + 0.1% BSA + 0.15% D-sorbitol pH 7.5 | 0.04 | 0.03 |

As the results shown in Table 30, the addition of first type of additive D-sorbitol at pH 7.5 into the polishing composition as chemical additive in the polishing compositions, the slopes of trench dishing vs the over polishing amounts were significant reduced while comparing that obtained from reference sample.

The addition of second type of additive BSA at pH 7.5 into the polishing composition as chemical additive in the polishing compositions, the slopes of trench dishing vs the over polishing amounts were slightly reduced while comparing that obtained from reference sample.

When using D-sorbitol and BSA as dual chemical additives at pH 7.5 in the polishing composition, the slopes of oxide trench dishing vs over polishing amount of oxide film were significantly reduced vs that from reference sample. The dual chemical additives in the same polishing composition at pH 7.5 afforded the lowest slope of oxide dishing vs over polishing amount of oxide film among all tested polishing compositions and reference sample.

The polishing conditions used for patterned wafer polishing were: Dow's IC1010 pad with 3.0 psi down force with table/head speeds at 87/93 rpm, and with insitu conditioning.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical planarization (CMP) composition for a semiconductor substrate having at least one surface comprising a silicon oxide film comprising:
   a. 0.05 to 10 weight percent of an abrasive selected from the group consisting of ceria-coated inorganic oxides, ceria coated organic polymer particles, and combinations thereof;
   b. 0.005 to 1.0 weight percent of a first additive selected from the group consisting of maltitol, lactitol, maltotritol, D-sorbitol, mannitol, dulcitol, D-(−)-fructose, beta-lactose, and combinations thereof;
   a second additive having a general structure selected from the group consisting of
   (g)

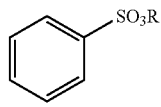

where —R can be hydrogen atom or a metal ion selected from the group consisting of sodium ion, potassium ion, and ammonium ion;
   (h)

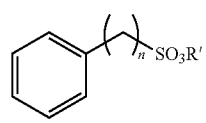

where —R' can be hydrogen atom or a metal ion selected from the group consisting of sodium ion, potassium ion, and ammonium ion; and n can be 1 to 12 which represents the various length of alkyl linkage group —CH$_2$—;
   and combinations of (g) and (h);
   c. a solvent selected from the group consisting of water, ethers and alcohols; and optionally
   d. a biocide and a pH adjuster;
wherein the composition comprises a pH ranging from 3 to 10.

2. The CMP composition of claim 1, wherein the abrasive is a ceria-coated inorganic oxide selected from the group consisting of: ceria-coated colloidal silica; ceria-coated alumina; ceria-coated titania; ceria-coated zirconia; and combinations thereof.

3. The CMP composition of claim 1, wherein the first additive has a general molecular structure of:

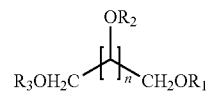

wherein: n is selected from 2 through 5,000 and R1, R3 and each occurrence of R2 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, and organic amine groups.

4. The CMP composition of claim 3, wherein R1, R2, and R3 are hydrogen.

5. The CMP composition of claim 1, wherein the first additive has a general molecular structure of:

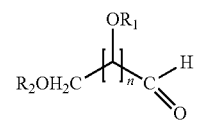

wherein n is selected from 2 to 5,000, and R2 and each occurrence of R1 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester and organic amine groups.

6. The CMP composition of claim 5, wherein n is selected from 3 through 12.

7. The CMP composition of claim 5, wherein R1 and R2 are hydrogen and n is selected from 3 through 4.

8. A method of chemical mechanical polishing (CMP) a semiconductor substrate having at least one surface comprising a silicon oxide film, comprising:
   a. contacting the at least one surface comprising a silicon oxide with a CMP polishing pad and the CMP composition of claim 1; and
   b. polishing the least one surface comprising silicon dioxide.

9. The method of claim 8; wherein the silicon oxide film is selected from the group consisting of Chemical vapor deposition (CVD), Plasma Enhance CVD (PECVD), High Density Deposition CVD(HDP), and spin on silicon oxide film.

10. The method of claim 9, wherein the silicon oxide film is SiO2 film.

11. The method of claim 10; wherein the semiconductor substrate further comprises a silicon nitride surface; and the step (b) comprises polishing the least one surface comprising silicon dioxide at a removal selectivity of silicon oxide: silicon nitride greater than 60.

12. The CMP composition of claim 1, wherein the first additive has a general molecular structure selected from the group consisting of:

(a)

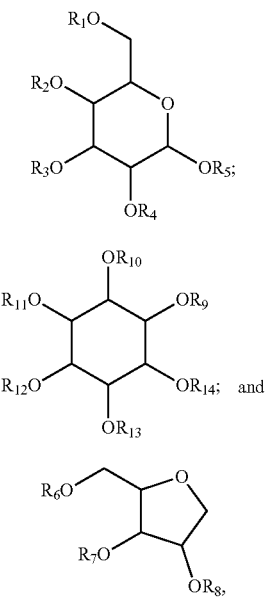

(b)

(c)

wherein R1, R2, R3, R4, R5, R6, R7, R8, R9, R10, R11, R12, R13, and R14 are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, and organic amine groups, with the proviso that at least two occurrences of R1 through R14 in each structure are hydrogen.

13. The CMP composition of claim 12, wherein the first additive is selected from the group consisting of: D-(–)-fructose, sorbitan, sucrose, beta-lactose, D-ribose, inositol, glucose and combinations thereof.

14. The CMP composition of claim 12, wherein the first additive has a general molecular structure:

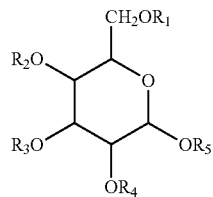

wherein R1 through R5 are independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine.

15. The CMP composition of claim 14, wherein the first additive is selected from the group consisting of: maltitol, lactitol and maltotritol.

16. The CMP composition of claim 14 wherein at least one of R1 through R5 is a polyol molecular unit having the structure:

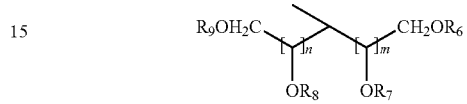

wherein n and m are independently selected from 1 through 5, and R6 through R9 are independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine.

17. The CMP composition of claim 16, wherein n and m are independently selected from 1 through 3.

18. The CMP composition of claim 16, wherein at least one of R1 through R5 is a six-member ring polyol having the structure:

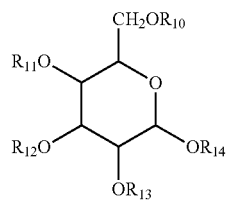

wherein R10, R11, R12, R13 and R14 are independently selected from the group consisting of hydrogen, alkyl, alkoxy, organic group with one or more hydroxyl groups, substituted organic sulfonic acid or salt, substituted organic carboxylic acid or salt, organic carboxylic ester, and an organic amine.

19. The CMP composition of claim 18, wherein at least two of R1 to R9 are hydrogen atoms.

20. The CMP composition of claim 18, wherein at least six of R1 to R9 are hydrogen atoms.

* * * * *